(12) United States Patent
Hahn et al.

(10) Patent No.: US 11,362,237 B2
(45) Date of Patent: Jun. 14, 2022

(54) HIGH-EFFICIENCY RED MICRO-LED WITH LOCALIZED CURRENT APERTURE

(71) Applicant: Facebook Technologies, LLC, Menlo Park, CA (US)

(72) Inventors: Berthold Hahn, Cork (IE); Thomas Lauermann, Cork (IE); Markus Broell, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 114 days.

(21) Appl. No.: 16/890,851

(22) Filed: Jun. 2, 2020

(65) Prior Publication Data

US 2021/0376194 A1 Dec. 2, 2021

(51) Int. Cl.
| H01L 33/38 | (2010.01) |
| H01L 23/00 | (2006.01) |
| H01L 27/15 | (2006.01) |
| H01L 33/00 | (2010.01) |
| H01L 33/02 | (2010.01) |
| H01L 33/06 | (2010.01) |
| H01L 33/24 | (2010.01) |
| H01L 33/30 | (2010.01) |
| H01L 33/46 | (2010.01) |

(Continued)

(52) U.S. Cl.
CPC ............ *H01L 33/382* (2013.01); *H01L 24/80* (2013.01); *H01L 27/156* (2013.01); *H01L 33/0016* (2013.01); *H01L 33/0033* (2013.01); *H01L 33/025* (2013.01); *H01L 33/06* (2013.01); *H01L 33/24* (2013.01); *H01L 33/30* (2013.01); *H01L 33/46* (2013.01); *H01L 33/58* (2013.01); *H01L 33/62* (2013.01); *H01L 2224/80013* (2013.01); *H01L 2224/80895* (2013.01); *H01L 2224/80896* (2013.01); *H01L 2933/0066* (2013.01)

(58) Field of Classification Search
CPC ............... H01L 33/382; H01L 33/0016; H01L 33/0033; H01L 33/025; H01L 33/06; H01L 33/24; H01L 33/30; H01L 33/46; H01L 33/58; H01L 33/62
See application file for complete search history.

(56) References Cited

U.S. PATENT DOCUMENTS

| 9,450,147 | B2 | 9/2016 | McGroddy et al. |
| 10,396,241 | B1 | 8/2019 | Perkins |
| 10,573,781 | B1 | 2/2020 | Munkholm et al. |

(Continued)

OTHER PUBLICATIONS

International Search Report and Written Opinion for International ApplicationNo. PCT/US2021/031456, dated Aug. 25, 2021, 10 pages.

*Primary Examiner* — Mark W Tornow
(74) *Attorney, Agent, or Firm* — Weaver Austin Villeneuve & Sampson LLP

(57) ABSTRACT

A micro-light emitting diode (micro-LED) includes a current aperture to confine the current in a localized region such that the carrier recombination mostly occurs in the localized region to emit photons, thereby reducing the surface recombination and improving the quantum efficiency. The current confinement and localization are achieved using a localized breakthrough of a barrier layer by a localized contact, lightly p-doped active layers to suppress lateral transport of the carriers to the surface region, selective ion implantation, etching, or oxidation of a semiconductor layer, or any combination thereof.

20 Claims, 20 Drawing Sheets

(51) Int. Cl.
*H01L 33/58* (2010.01)
*H01L 33/62* (2010.01)

(56) References Cited

U.S. PATENT DOCUMENTS

| | | | |
|---|---|---|---|
| 2010/0096641 | A1 | 4/2010 | Hwang et al. |
| 2010/0276726 | A1* | 11/2010 | Cho ........................ H01L 33/44 |
| | | | 257/103 |
| 2011/0003410 | A1* | 1/2011 | Tsay ........................ H01L 33/44 |
| | | | 438/27 |
| 2015/0187991 | A1* | 7/2015 | McGroddy ............ H01L 33/30 |
| | | | 257/13 |
| 2017/0170360 | A1* | 6/2017 | Bour ................... H01L 33/0008 |
| 2018/0047868 | A1* | 2/2018 | David ................... H01L 33/025 |
| 2019/0115498 | A1* | 4/2019 | Wu ..................... H01L 25/0753 |
| 2019/0305183 | A1* | 10/2019 | Lutgen ................... H01L 33/20 |

\* cited by examiner

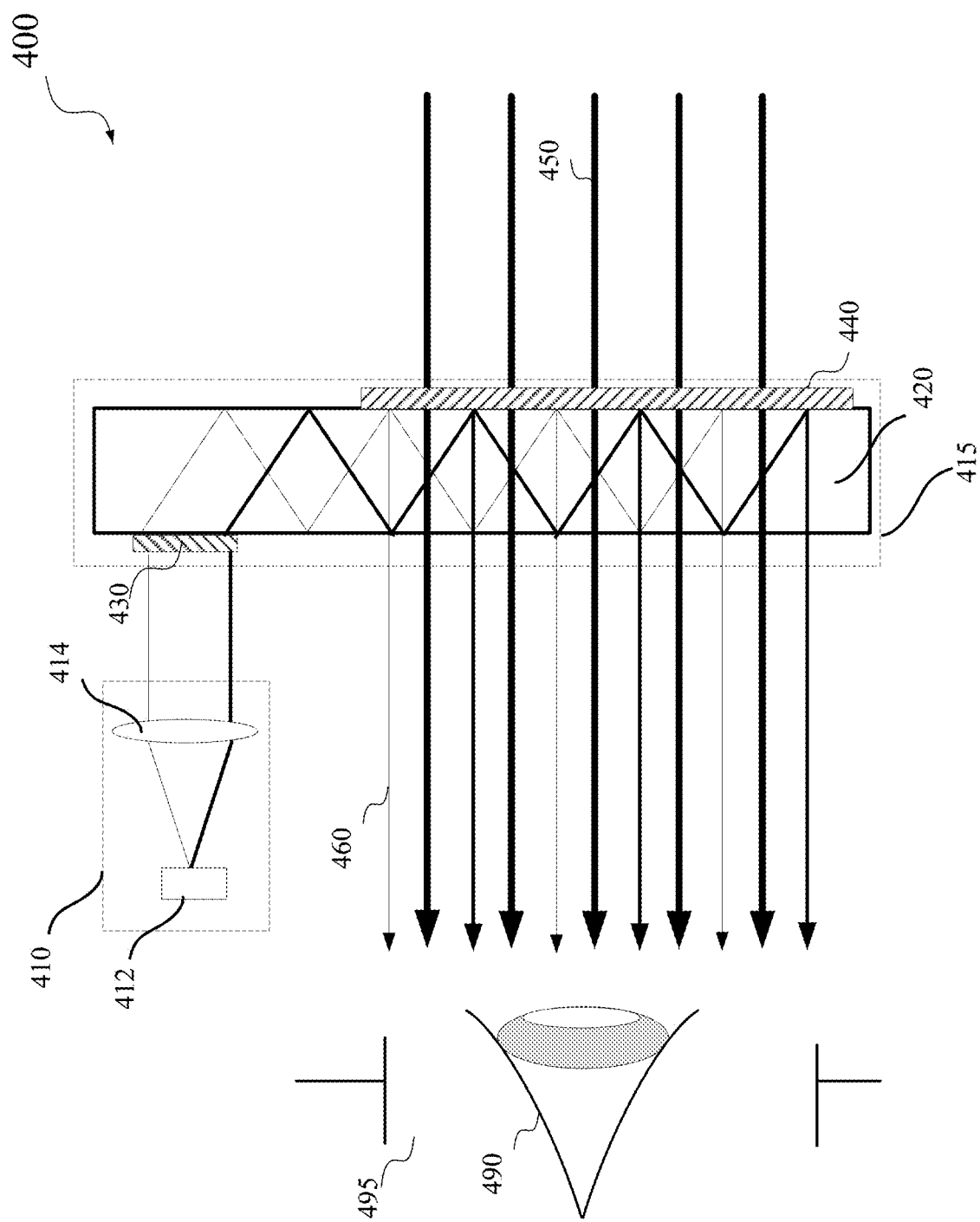

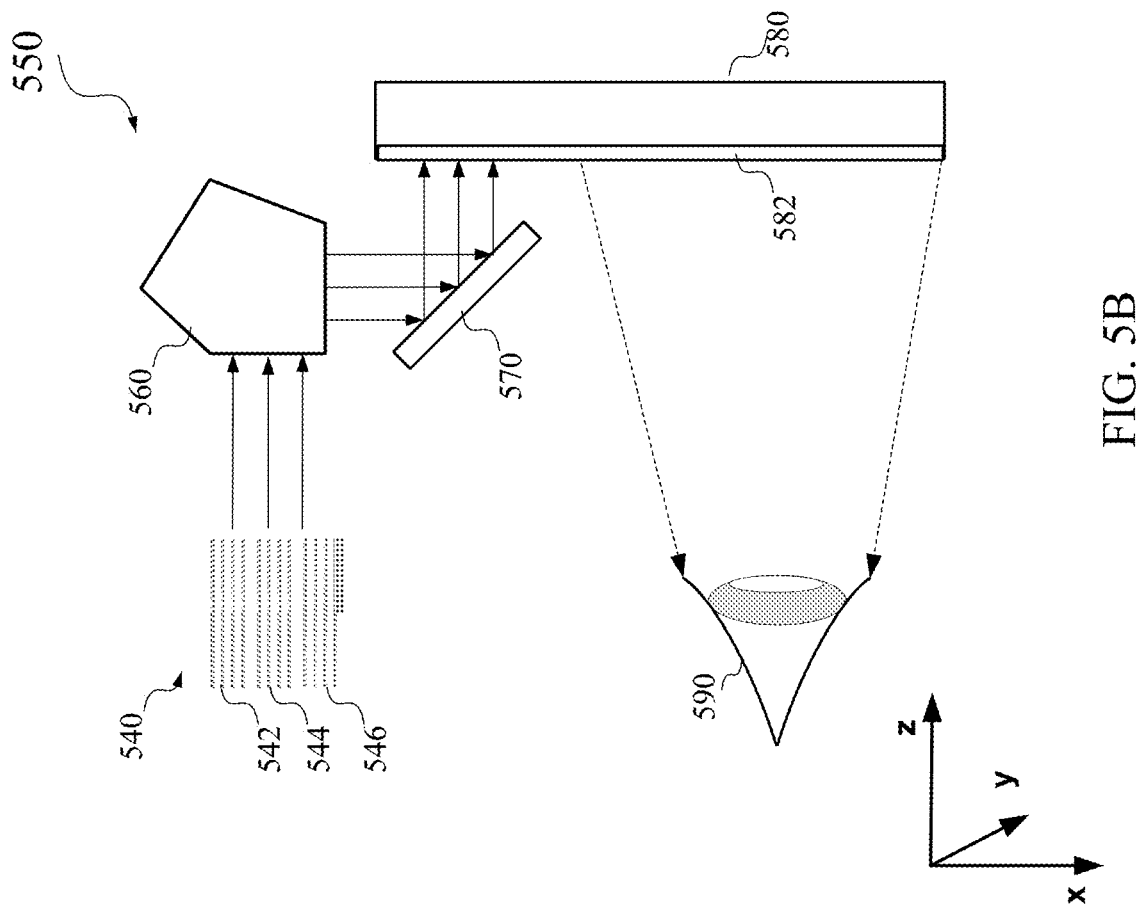
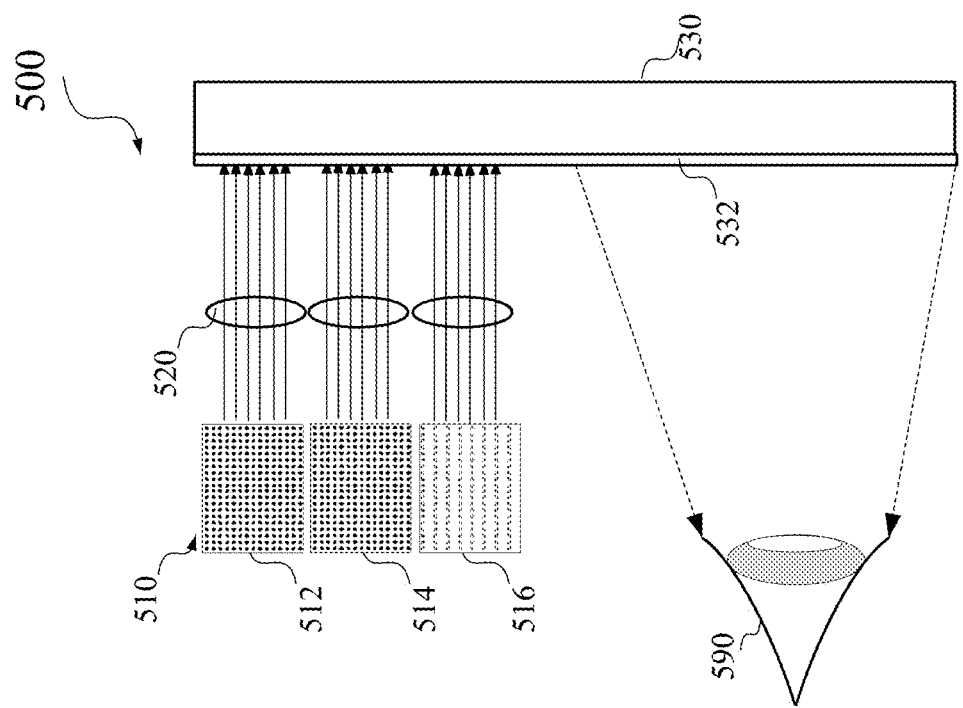
FIG. 5B
FIG. 5A

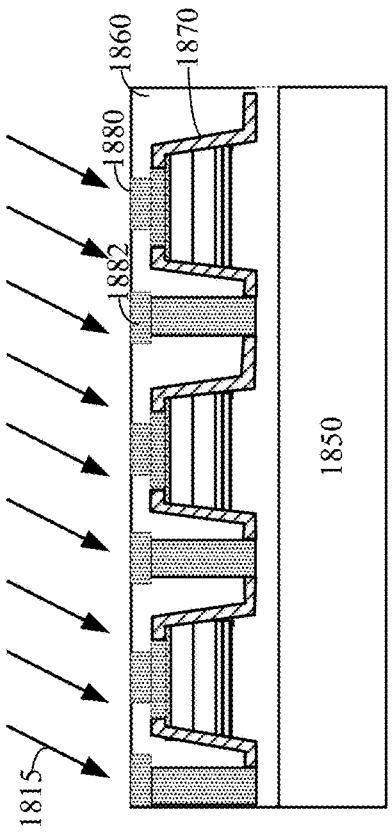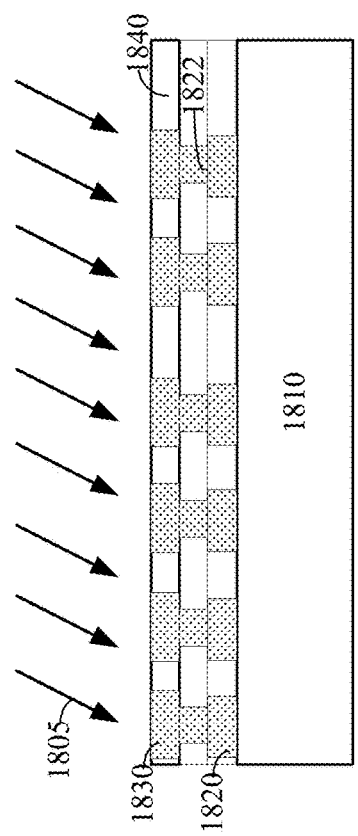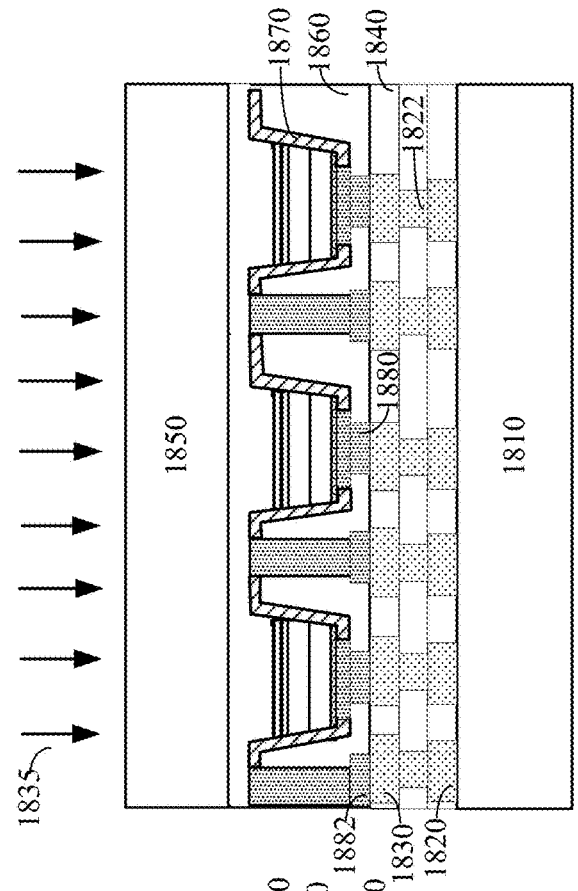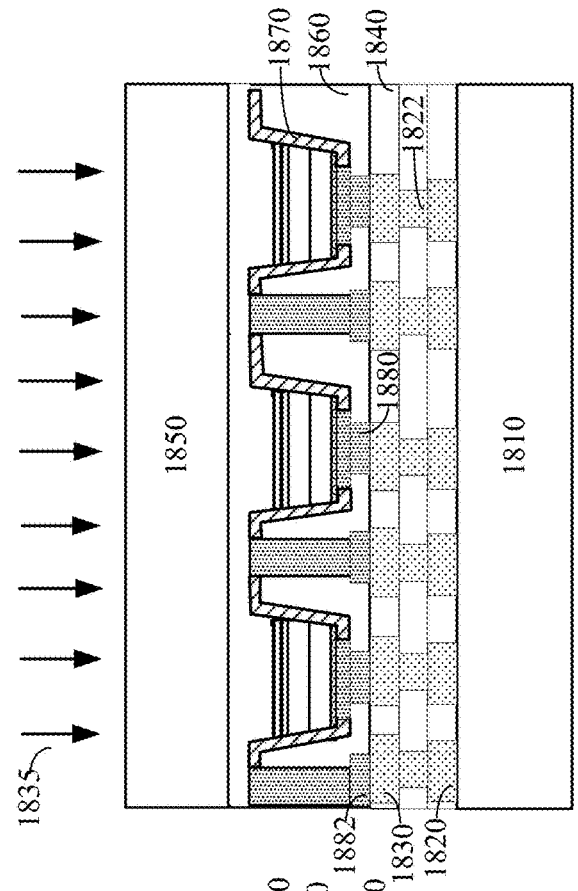

HIGH-EFFICIENCY RED MICRO-LED WITH LOCALIZED CURRENT APERTURE

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of GaN, InN, AlGaInP, other quaternary phosphide compositions, and the like, have begun to be developed for various display applications due to their small size, high packing density, higher resolution, and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs). More specifically, this disclosure relates to improving the quantum efficiencies of micro-LEDs, such AlGaInP-based red micro-LEDs. According to certain embodiments, a micro-LED may include a first n-type semiconductor layer, an active region on the first n-type semiconductor layer, a first p-type semiconductor layer on the active region, a carrier barrier region on the first p-type semiconductor layer, and an electrode including a tapered or submicron structure that is in contact with the carrier barrier region and is configured to apply an electric field to a localized area of the carrier barrier region to cause a breakthrough in the localized area of the carrier barrier region.

In some embodiments of the micro-LED, the carrier barrier region may include a second n-type semiconductor layer on the first p-type semiconductor layer, and a second p-type semiconductor layer on the second n-type semiconductor layer, where the second p-type semiconductor layer, the second n-type semiconductor layer, and the first p-type semiconductor layer may form a PNP device. The PNP device and the first n-type semiconductor layer may form a thyristor. In some embodiments, the carrier barrier region may include an n+ semiconductor layer on the first p-type semiconductor layer, the first p-type semiconductor layer may include a p+ semiconductor layer, and the n+ semiconductor layer and the first p-type semiconductor layer may form a tunnel junction. In some embodiments, the carrier barrier region may include a tunnel barrier layer on the first p-type semiconductor layer, and a second n-type semiconductor layer on the first p-type semiconductor layer, where the tunnel barrier layer may have a higher bandgap than the first p-type semiconductor layer and the second n-type semiconductor layer. In some embodiments, the carrier barrier region may include a heterojunction, a Schottky barrier, or a heterobarrier that induces band bending to form a tunnel contact. In some embodiments, a distance between the carrier barrier region and the active region may be less than a carrier diffusion length of the active region. In some embodiments, the localized area of the carrier barrier region may be characterized by a linear dimension less than one third of a linear dimension of the micro-light emitting diode.

In some embodiments, the active region may include an AlGaInP quantum well and may be configured to emit red light. In some embodiments, the active region may include at least one of a p-doped quantum barrier layer or a p-doped quantum well layer. The p-doped quantum well layer may be characterized by an acceptor concentration between about $1 \times 10^{17}/cm^3$ and about $1 \times 10^{19}/cm^3$. In some embodiments, the tapered or submicron structure may include a spike or a tapered tip extending into the carrier barrier region. In some embodiments, the micro-LED may be characterized by a linear dimension less than 20 µm.

According to some embodiments, a micro-LED may include a first n-type semiconductor layer, an active region on the first n-type semiconductor layer and including at least one p-doped quantum well, a first p-type semiconductor layer on the active region, a current confinement structure including a localized current aperture and configured to inject carriers into the active region through the localized current aperture, and an electrode on the localized current aperture of the current confinement structure.

In some embodiments of the micro-LED, the current confinement structure may include a carrier barrier layer, and the electrode may include a tapered or submicron structure that is in contact with the carrier barrier layer and is configured to apply an electric field to a localized area of the carrier barrier layer to cause a breakthrough in the localized area of the carrier barrier layer to form the localized current aperture. In some embodiments, the carrier barrier layer may include a second n-type semiconductor layer on the first p-type semiconductor layer, and a second p-type semiconductor layer on the second n-type semiconductor layer, where the second p-type semiconductor layer, the second n-type semiconductor layer, the first p-type semiconductor layer, and the first n-type semiconductor layer may form a thyristor. In some embodiments, the carrier barrier layer may include a tunnel junction or a heterojunction. In some embodiments, the p-doped quantum well may be characterized by an acceptor concentration between $1 \times 10^{17}/cm^3$ and $1 \times 10^{19}/cm^3$. In some embodiments, the localized current aperture may be characterized by a linear dimension less than one third of a linear dimension of the micro-light emitting diode. In some embodiments, the active region may include an AlGaInP layer and may be configured to emit red light.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 4 illustrates an example of an optical see-through augmented reality system including a waveguide display according to certain embodiments.

FIG. 5A illustrates an example of a near-eye display device including a waveguide display according to certain embodiments.

FIG. 5B illustrates an example of a near-eye display device including a waveguide display according to certain embodiments.

FIGS. 18A-18D illustrates an example of a method of hybrid bonding for arrays of LEDs according to certain embodiments.

Figure 1:
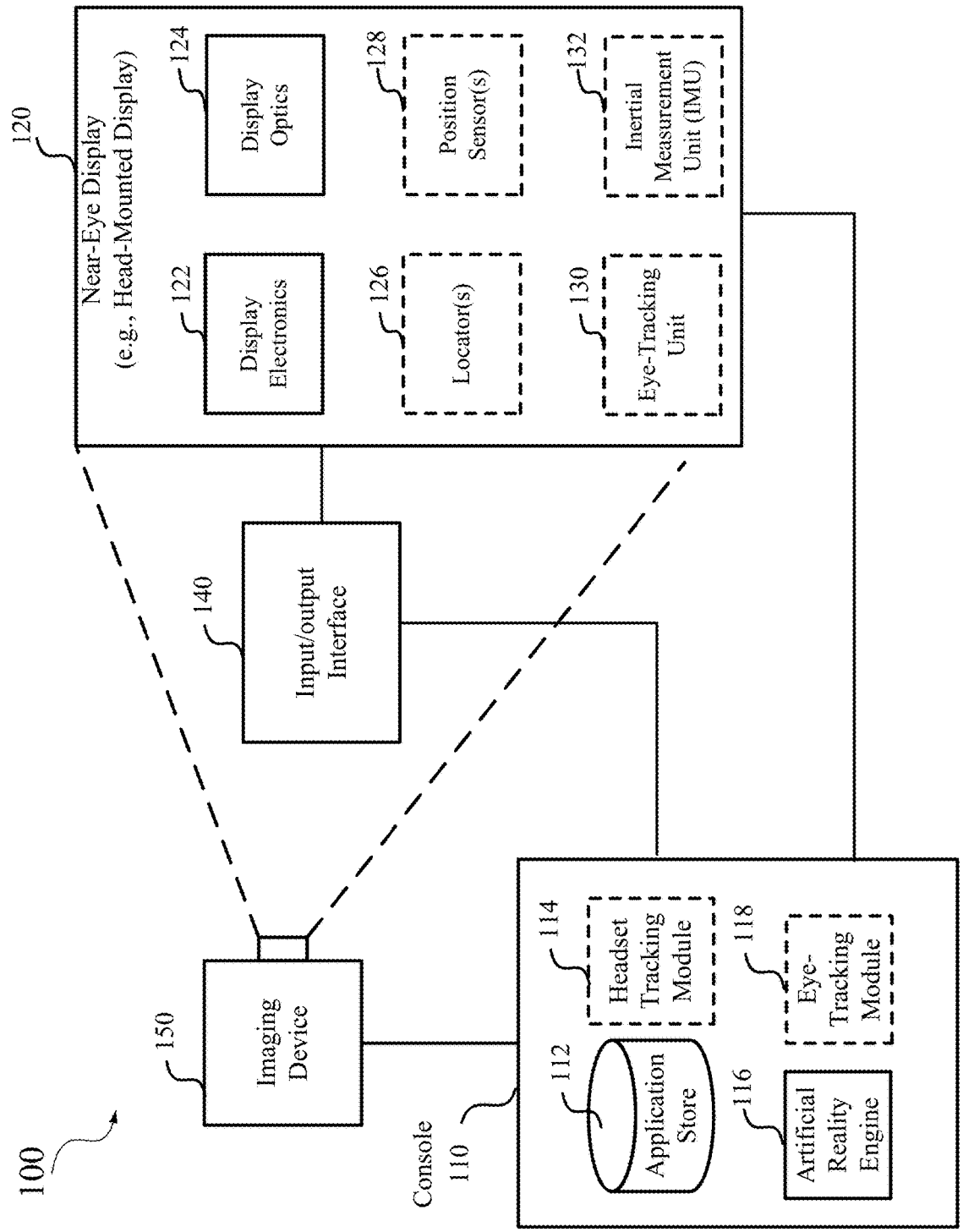
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diodes (micro-LEDs). More specifically, and without limitation, disclosed herein are techniques for improving the efficiency of micro-LEDs, such as AlGaInP-based red micro-LEDs. Various inventive embodiments are described herein, including devices, systems, methods, materials, processes, and the like.

In semiconductor light emitting diodes (LEDs), photons are usually generated at a certain internal quantum efficiency (IQE) through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency (EQE), which describes how efficiently the LED converts injected electrons to photons that are extracted from the LED. For LEDs, and in particular, micro-LEDs with reduced physical dimensions, the internal and external quantum efficiencies may be very low, and improving the quantum efficiency of the LEDs can be challenging.

The quantum efficiency of LEDs depends on the relative rates of competitive radiative (light producing) recombination and non-radiative (lossy) recombination that occur in the active region of the LEDs. Non-radiative recombination processes in the active region include Shockley-Read-Hall (SRH) recombination at defect sites and electron-electron-hole (eeh) and/or electron-hole-hole (ehh) Auger recombination, which is a non-radiative process involving three carriers. In micro-LEDs, because the size of an LED may be comparable to the minority carrier diffusion length, a larger proportion of the total active region may be within a distance less than the minority carrier diffusion length from the LED sidewall surfaces where the defect density and the non-radiative recombination rate may be high, and thus more injected carriers may diffuse to the regions near the sidewall surfaces and may be subjected to the higher SRH recombination rate. This may cause the peak efficiency of the LED to decrease or cause the peak efficiency operating current to increase. Increasing the current injection may cause the efficiencies of the micro-LEDs to drop due to the higher eeh or ehh Auger recombination rate at a higher current density. As the physical size of LEDs is further reduced, efficiency losses due to surface recombination near the etched sidewall facets that include surface imperfections become much more significant. AlGaInP material has a high surface recombination velocity and minority carrier diffusion length. For example, carriers in the AlGaInP material can have high diffusivity (mobility), and the AlGaInP material may have an order of magnitude higher surface recombination velocity than III-nitride materials. Thus, the internal and external quantum efficiencies of AlGaInP red LEDs may drop even more significantly as the device size reduces.

According to certain embodiments, a micro-LED, such as an AlGaInP red micro-LED, may include a current aperture to confine the current in a localized region that is much smaller than the size of the micro-LED, such that the carrier recombination may mostly occur in the localized region to emit photons and the diffusion of the injected carriers in the active region to the sidewall of the micro-LED can be reduced, thereby reducing the surface recombination and improving the quantum efficiency. The current confinement and localization can be achieved using, for example, (1) a localized breakthrough of a barrier layer (e.g., a thyristor, a tunnel junction, a heterojunction, etc.) by a localized contact (e.g., a spiked p-contact, a submicron p-contact, or a filament) that is used to generate a high electric field at a localized region or using localized defects in the barrier layer, which may cause the localized injection and confinement of carriers into the active region, (2) selective ion implantation, etching, oxidation, and the like, of a semiconductor layer, (3) lightly p-doped active layers to suppress lateral transport (e.g., diffusion) of the carriers to the surface region, or any combination thereof. The current localization can also cause self-heating of the semiconductor, which may in turn reduce the diffusion of carriers to the sidewalls in the active region due to the reduced carrier diffusivity and mobility at higher temperature. Light p-doping in the active region can cause the trap states at the surface of the active region to be farther away from the Fermi level and can form a hole depletion region that reduces the diffusion of holes to the sidewall region. Therefore, the hole concentration at the sidewall region can be reduced, and thus the non-radiative surface recombination can be reduced. Furthermore, due to the confinement and localization of the injected current, light emission may only occur in a localized region, which may facilitate more efficient light extraction and out-coupling from the micro-LED. Therefore, the overall external quantum efficiency of the micro-LED can be improved.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions.

Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
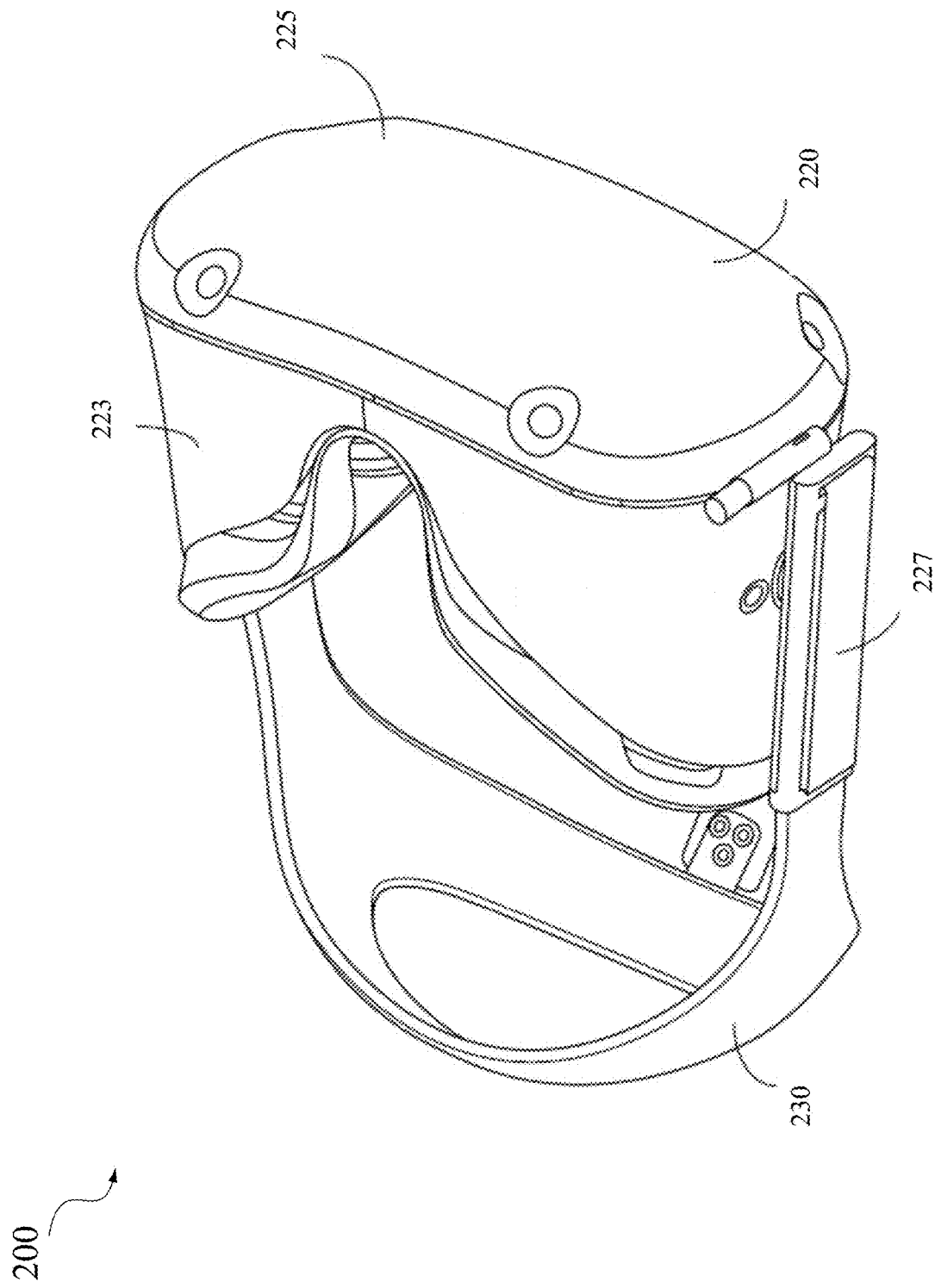
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendable length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
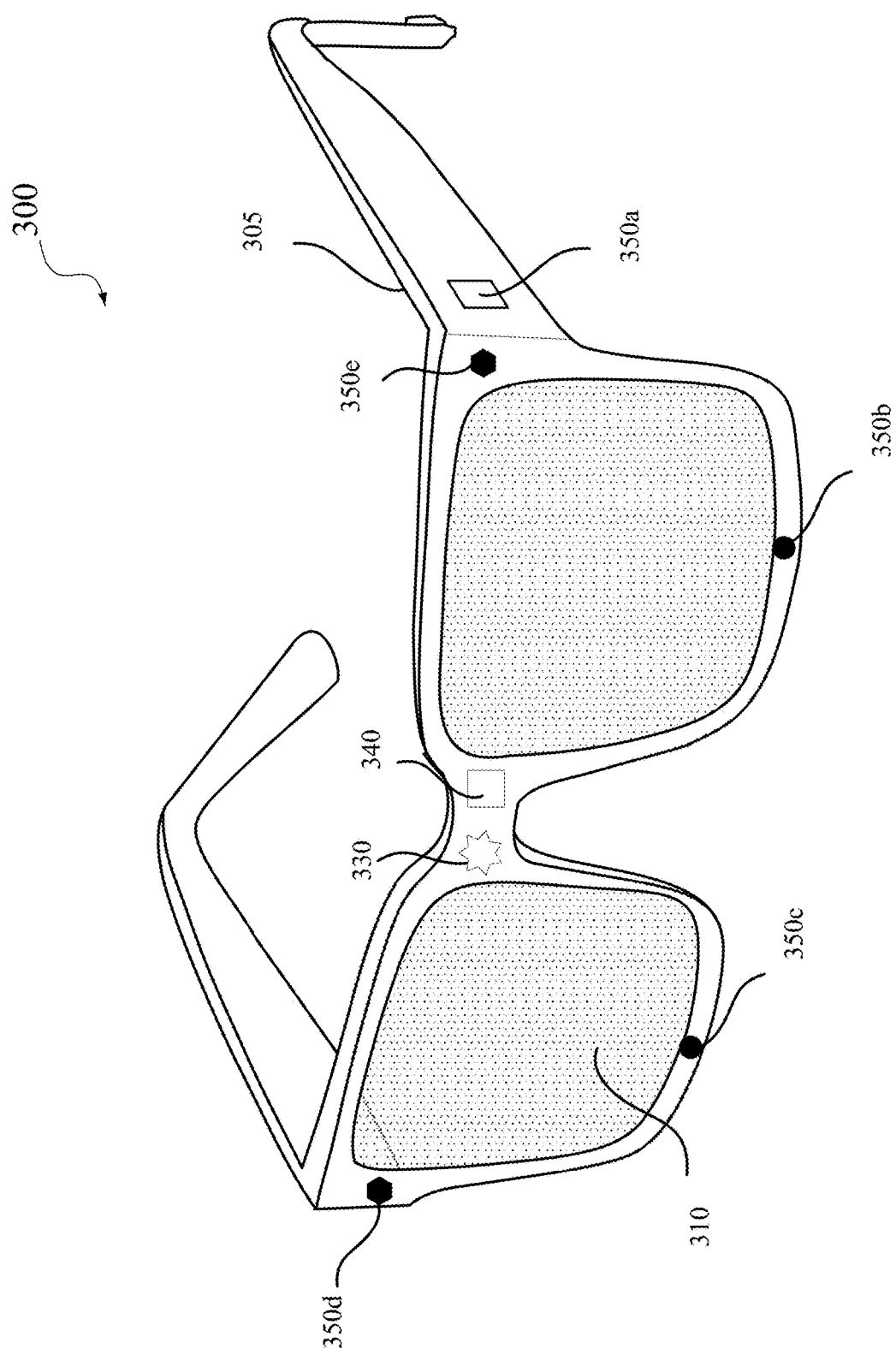
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350*a*, 350*b*, 350*c*, 350*d*, and 350*e* on or within frame 305. In some embodiments, sensors 350*a*-350*e* may include one or more depth sensors, motion sensors, position sensors, inertial sensors, or ambient light sensors. In some embodiments, sensors 350*a*-350*e* may include one or more image sensors configured to generate image data representing different fields of views in different directions. In some embodiments, sensors 350*a*-350*e* may be used as input devices to control or influence the displayed content of near-eye display 300, and/or to provide an interactive VR/AR/MR experience to a user of near-eye display 300. In some embodiments, sensors 350*a*-350*e* may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350*a*-350*e* in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
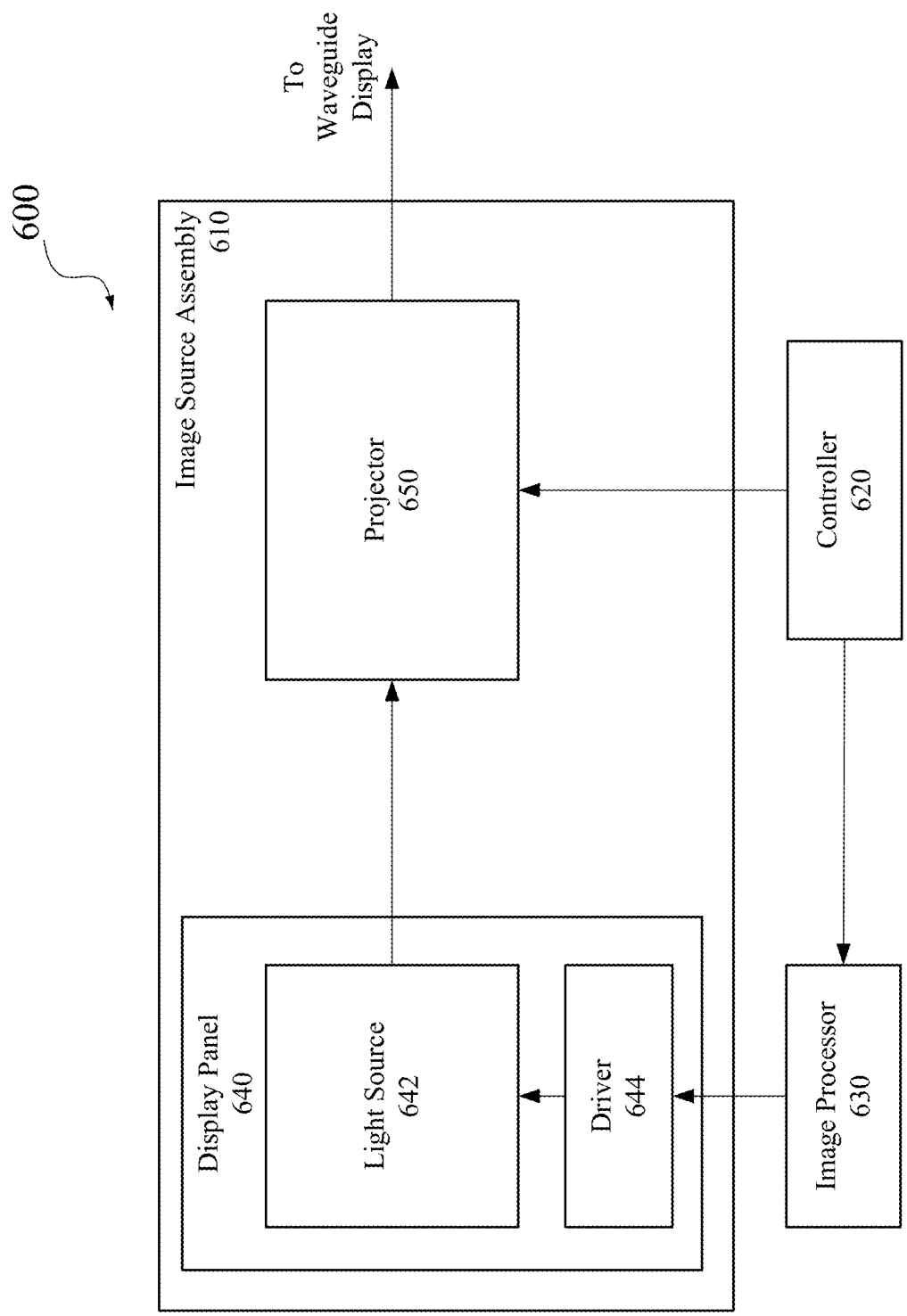
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

The overall efficiency of a photonic integrated circuit or a waveguide-based display (e.g., in augmented reality system 400 or NED device 500 or 550) may be a product of the efficiency of individual components and may also depend on how the components are connected. For example, the overall efficiency $\eta_{tot}$ of the waveguide-based display in augmented reality system 400 may depend on the light emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = \eta_{EQE} \times \eta_{in} \times \eta_{out}, \quad (1)$$

where $\eta_{EQE}$ is the external quantum efficiency of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The optical coupler (e.g., input coupler 430 or coupler 532) that couples the emitted light from a light source to a waveguide may include, for example, a grating, a lens, a micro-lens, a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source.

The light sources, image sources, or other displays described above may include one or more LEDs. For example, each pixel in a display may include three subpixels that include a red micro-LED, a green micro-LED, and a blue micro-LED. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may generally include an n-type material layer, an active layer that may include hetero-structures (e.g., one or more quantum wells), and a p-type material layer. The multiple layers of semiconductor materials may be grown on a surface of a substrate having a certain orientation.

Photons can be generated in a semiconductor LED (e.g., a micro-LED) at a certain internal quantum efficiency through the recombination of electrons and holes within the active layer (e.g., including one or more semiconductor layers). The generated light may then be extracted from the LEDs in a particular direction or within a particular solid angle. The ratio between the number of emitted photons extracted from the LED and the number of electrons passing through the LED is referred to as the external quantum efficiency, which describes how efficiently the LED converts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency can be challenging. In some embodiments, to increase the light extraction efficiency, a mesa that includes at least some of the layers of semiconductor materials may be formed.

Figure 7A:
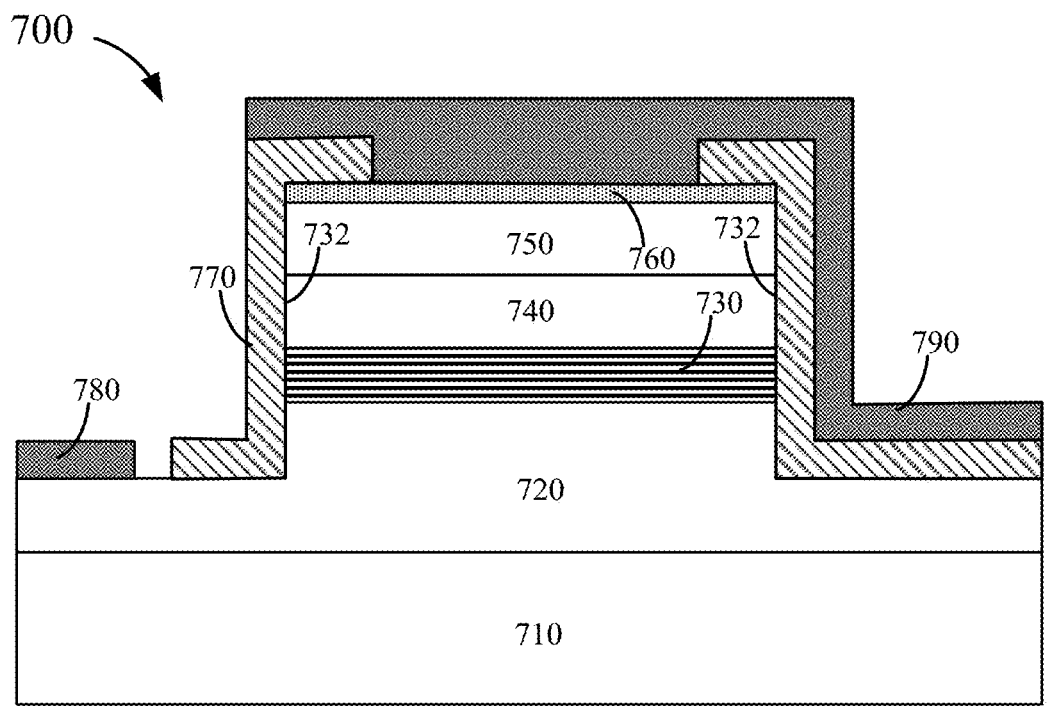
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlGaInP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlGaInP situated between a layer of p-type AlGaInP doped with zinc or magnesium and a layer of n-type AlGaInP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a SiO$_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlGaInP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
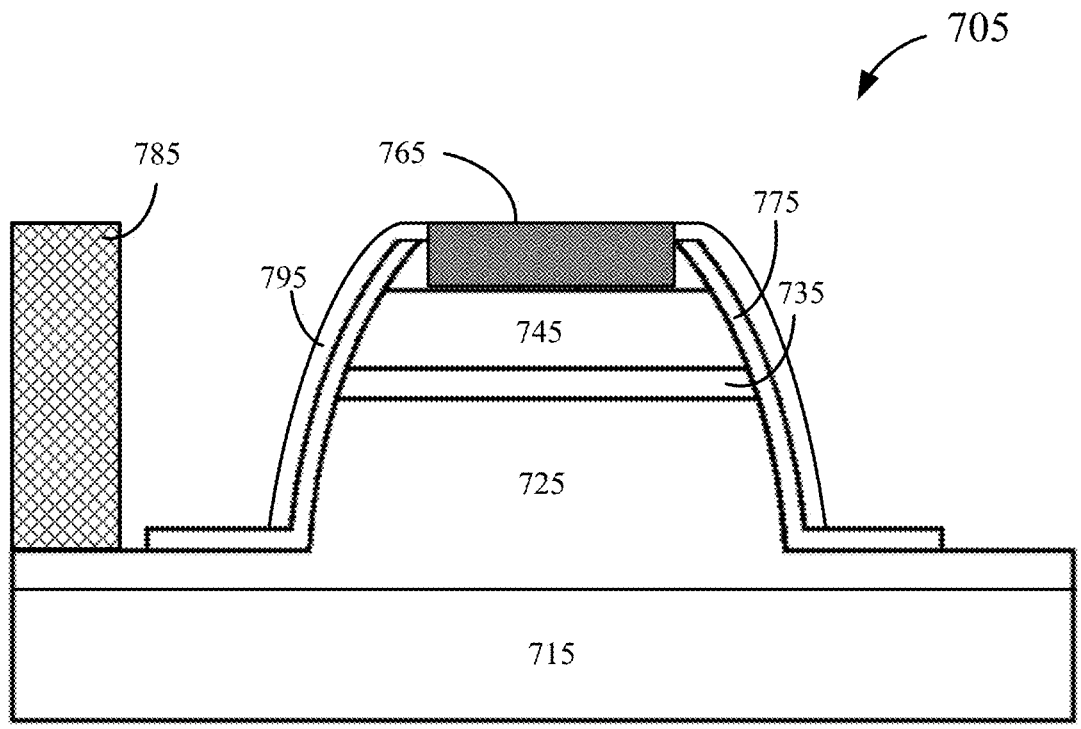
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlGaInP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., SiO$_2$ or SiN$_x$) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlGaInP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

When the mesa structure is formed (e.g., etched), the facets of the mesa structure, such as mesa sidewalls 732, may include some imperfections, such as unsatisfied bonds, chemical contamination, and structural damages (e.g., when dry-etched), that may decrease the internal quantum efficiency of the LED. For example, at the facets, the atomic lattice structure of the semiconductor layers may come to an abrupt end, where some atoms of the semiconductor materials may lack neighbors to which bonds may be attached. This results in "dangling bonds," which may be characterized by unpaired valence electrons. These dangling bonds create energy levels that otherwise would not exist within the bandgap of the semiconductor material, causing non-radiative electron-hole recombination at or near the facets of the mesa structure. Thus, these imperfections may become the recombination centers where electrons and holes may be confined until they combine non-radiatively.

As described above, the internal quantum efficiency is the proportion of the radiative electron-hole recombination in the active region that emits photons. The internal quantum efficiency of LEDs depends on the relative rates of competitive radiative (light producing) recombination and non-radiative (lossy) recombination that occur in the active region of the LEDs. Non-radiative recombination processes in the active region may include Shockley-Read-Hall (SRH) recombination at defect sites and eeh/ehh Auger recombination, which is a non-radiative process involving three carriers. The internal quantum efficiency of an LED may be determined by:

$$IQE = \frac{BN^2}{AN + BN^2 + CN^3}, \qquad (2)$$

where A, B and C are the rates of SRH recombination, bimolecular (radiative) recombination, and Auger recombination, respectively, and N is the charge-carrier density (i.e., charge-carrier concentration) in the active region.

Figure 8:
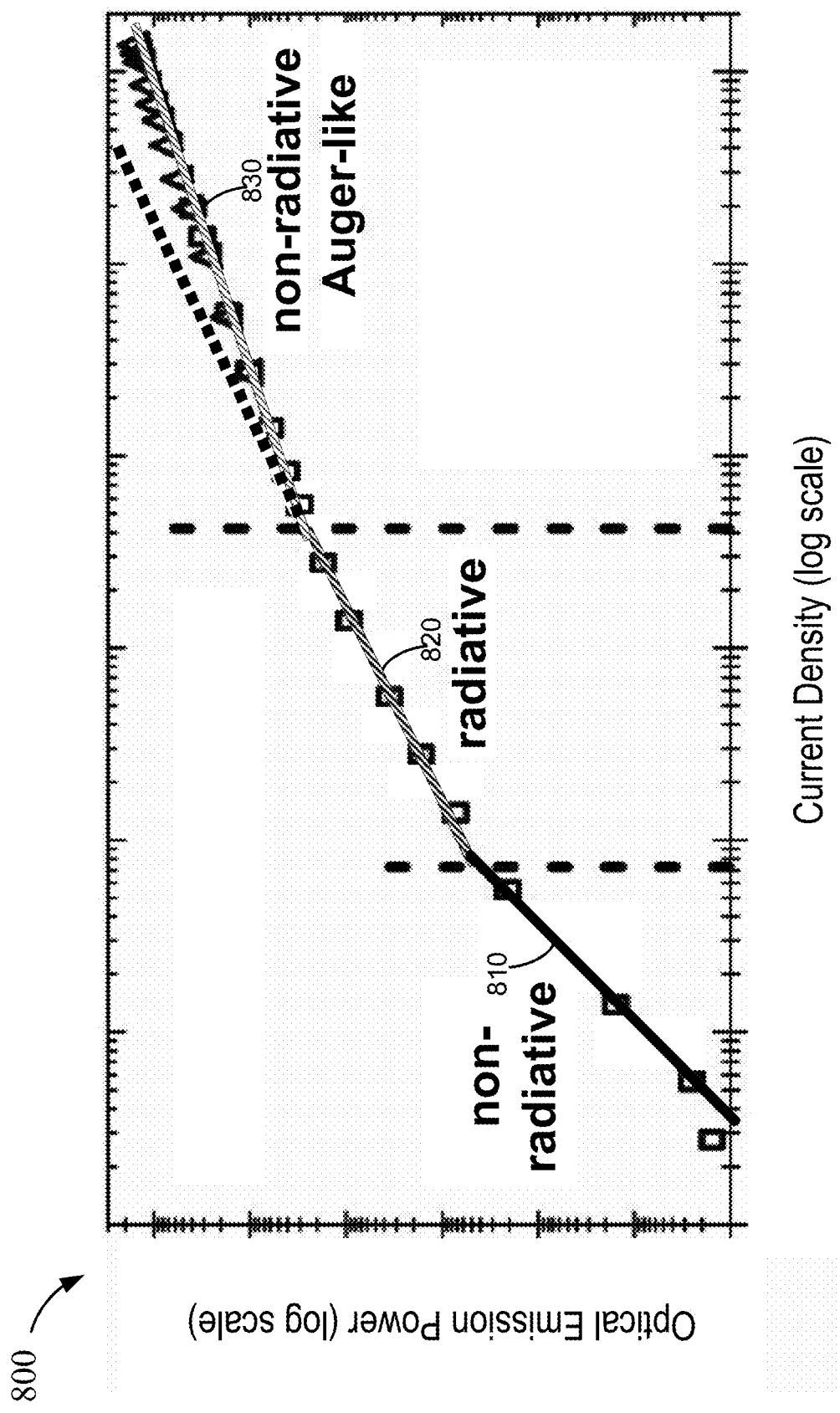
FIG. 8 illustrates the relationship between the optical emission power and the current density of a light emitting diode.

FIG. 8 illustrates the relationship between the optical emission power and the current density of a light emitting diode. As illustrated by a curve 810 in FIG. 8, the optical emission power of a micro-LED device may be low when the current density (and thus the charge carrier density N) is low, where the low external quantum efficiency may be caused by the relatively high non-radiative SRH recombination when the charge carrier density N is low according to equation (2). As the current density (and thus the charge carrier density N) increases, the optical emission power may increase as shown by a curve 820 in FIG. 8, because the radiative recombination may increase at a higher rate ($\propto N^2$) than the non-radiative SRH recombination ($\propto N$) when the charge carrier density N is high according to equation (2). As the current density increases further, the optical emission power may increase at a slower rate as shown by a curve 830 in FIG. 8 and thus the external quantum efficiency may drop as well because, for example, the non-radiative Auger recombination may increase at a higher rate ($\propto N^3$) than the radiative recombination ($\propto N^2$) when the charge carrier density N is sufficiently high according to equation (2).

Auger recombination is a non-radiative process involving three carriers. Auger recombination may be a major cause of efficiency droop and may be direct or indirect. For example, direct Auger recombination occurs when an electron and a hole recombine, but instead of producing light, either an electron is raised higher into the conduction band or a hole is pushed deeper into the valence band. Auger recombination may be reduced to mitigate the efficiency droop by lowering the charge-carrier density N in the active region for a given injection current density J, which may be written as:

$$J = q d_{\mathit{eff}}(AN + BN^2 + CN^3), \qquad (3)$$

where $d_{eff}$ is the effective thickness of the active region. Thus, according to equation (3), the effect of the Auger recombination may be reduced and thus the IQE of the LED may be improved by reducing the charge-carrier density N for a given injection current density, which may be achieved by increasing the effective thickness of the active region $d_{eff}$. The effective thickness of the active region may be increased by, for example, growing multiple quantum wells (MQWs). Alternatively, an active region including a single thick double heterostructure (DH) may be used to increase the effective thickness of the active region.

One factor affecting the effective thickness of the active region is the presence of internal fields $E_{qw}$ (e.g., strain-induced internal field) in the quantum wells. Internal fields $E_{qw}$ may localize charge carriers and reduce the overlap integral between carrier wave functions, which may reduce the radiative efficiency of LEDs. Some LEDs including heterostructures (e.g., quantum wells) may have a strong internal strain-induced piezoelectric field in the carrier transport direction. The strain-induced internal field may cause the electron and hole energy levels to shift (thus changing the bandgap) and cause the electrons and holes to shift to opposite sides of a quantum well, thereby decreasing the spatial electron-hole overlap and reducing the radiative recombination efficiency and thus the internal quantum efficiency of the LED.

While the Auger recombination due to a high current density (and high charge carrier density) may be an intrinsic process depending on material properties, non-radiative SRH recombination depends on the characteristics and the quality of material, such as the defect density in the active region. As described above with respect to FIGS. 7A and 7B, LEDs may be fabricated by etching a mesa structure into the active emitting layers to confine carriers within the injection area of the device and to expose the n-type material beneath the active emitting layers for electrical contact. Etching the mesa structures may lead to the formation of mesa sidewalls that are orthogonal to the growth plane. As described above, due to the etching, the active region in proximity to the exposed sidewalls may have a higher density of defects, such as dislocations, pores, grain boundaries, vacancies, inclusion of precipitates, and the like. The defects may introduce energy states having deep or shallow energy levels in the bandgap. Carriers may be trapped by these energy states until they combine non-radiatively. Therefore, the active region in proximity to the exposed sidewalls may have a higher rate of SRH recombination than the bulk region that is far from the sidewalls.

Parameters that may affect the impact on the LED efficiency by the non-radiative surface recombination may include, for example, the surface recombination velocity (SRV) S, the carrier diffusion coefficient (diffusivity) D, and the carrier life time $\tau$. The high recombination rate in the vicinity of the sidewall surfaces due to the high defect density may depend on the number of excess carriers (in particular, the minority carriers) in the region. The high recombination rate may deplete the carriers in the region. The depletion of the carriers in the region may cause carriers to diffuse to the region from surrounding regions with higher carrier concentrations. Thus, the amount of surface recombination may be limited by the surface recombination velocity S at which the carriers move to the regions near the sidewall surfaces. The carrier life time $\tau$ is the average time that a carrier can spend in an excited state after the electron-hole generation before it recombines with another carrier. The carrier life time $\tau$ generally depends on the carrier concentration and the recombination rate in the active region. The carrier diffusion coefficient (diffusivity) D of the material and the carrier life time $\tau$ may determine the carrier diffusion length $L=\sqrt{D\times\tau}$, which is the average distance a carrier can travel from the point of generation until it recombines. The carrier diffusion length L characterizes the width of the region that is adjacent to a sidewall surface of the active region and where the contribution of surface recombination to the carrier losses is significant. Charge carriers injected or diffused into the regions that are within a minority carrier diffusion length from the sidewall surfaced may be subject to the higher SRH recombination rate.

A higher current density (e.g., in units of amps/cm²) may associated with a lower surface recombination velocity as the surface defects may be more and more saturated at higher carrier densities. Thus, the surface recombination velocity may be reduced by increasing the current density. In addition, the diffusion length of a given material may vary with the current density at which the device is operated. However, LEDs generally may not be operated at high current densities. Increasing the current injection may also cause the efficiencies of the micro-LEDs to drop due to the higher Auger recombination rate and the lower conversion efficiency at the higher temperature caused by self-heating at the higher current density.

For traditional, broad area LEDs used in lighting and backlighting applications (e.g., with an about 0.1 mm² to about 1 mm² lateral device area), the sidewall surfaces are at the far ends of the devices. The devices can be designed such that little or no current is injected into regions within a minority carrier diffusion length of the mesa sidewalls, and thus the sidewall surface area to volume ratio and the overall rate of SRH recombination may be low. However, in micro-LEDs, as the size of the LED is reduced to a value comparable to or having a same order of magnitude as the minority carrier diffusion length, the increased surface area to volume ratio may lead to a high carrier surface recombination rate, because a greater proportion of the total active region may fall within the minority carrier diffusion length from the LED sidewall surface. Therefore, more injected carriers are subjected to the higher SRH recombination rate. This can cause the leakage current of the LED to increase and the efficiency of the LED to decrease as the size of the LED decreases, and/or cause the peak efficiency operating current to increase as the size of the LED decreases. For example, for a first LED with a 100 μm×100 μm×2 μm mesa, the side-wall surface area to volume ratio may be about 0.04. However, for a second LED with a 5 μm×5 μm×2 μm mesa, the side wall surface area to volume ratio may be about 0.8, which is about 20 times higher than the first LED. Thus, with a similar surface defect density, the SRH recombination coefficient of the second LED may be about 20 times higher as well. Therefore, the efficiency of the second LED may be reduced significantly.

AlGaInP material may have a high surface recombination velocity and minority carrier diffusion length than some other light emission materials, such as III-nitride materials. For example, red AlGaInP LEDs may generally operate at a reduced carrier concentration (e.g., about $10^{17}$ to $10^{18}$ cm⁻³), and thus may have a relatively long carrier life time $\tau$. The carrier diffusivity D in the active region in the undoped quantum wells of red AlGaInP LEDs may also be rather large. As a result, the carrier diffusion length $L=\sqrt{D\times\tau}$ can be, for example, about 10-25 μm or longer in some devices. In addition, the surface recombination velocity of AlGaInP material may be an order of magnitude higher than the surface recombination velocities of III-nitride materials. Thus, compared with LED made of III-nitride materials (e.g., blue and green LEDs made of GaN), the internal and external quantum efficiencies of AlGaInP-based red LEDs can drop even more significantly as the device size decreases.

Figure 9:
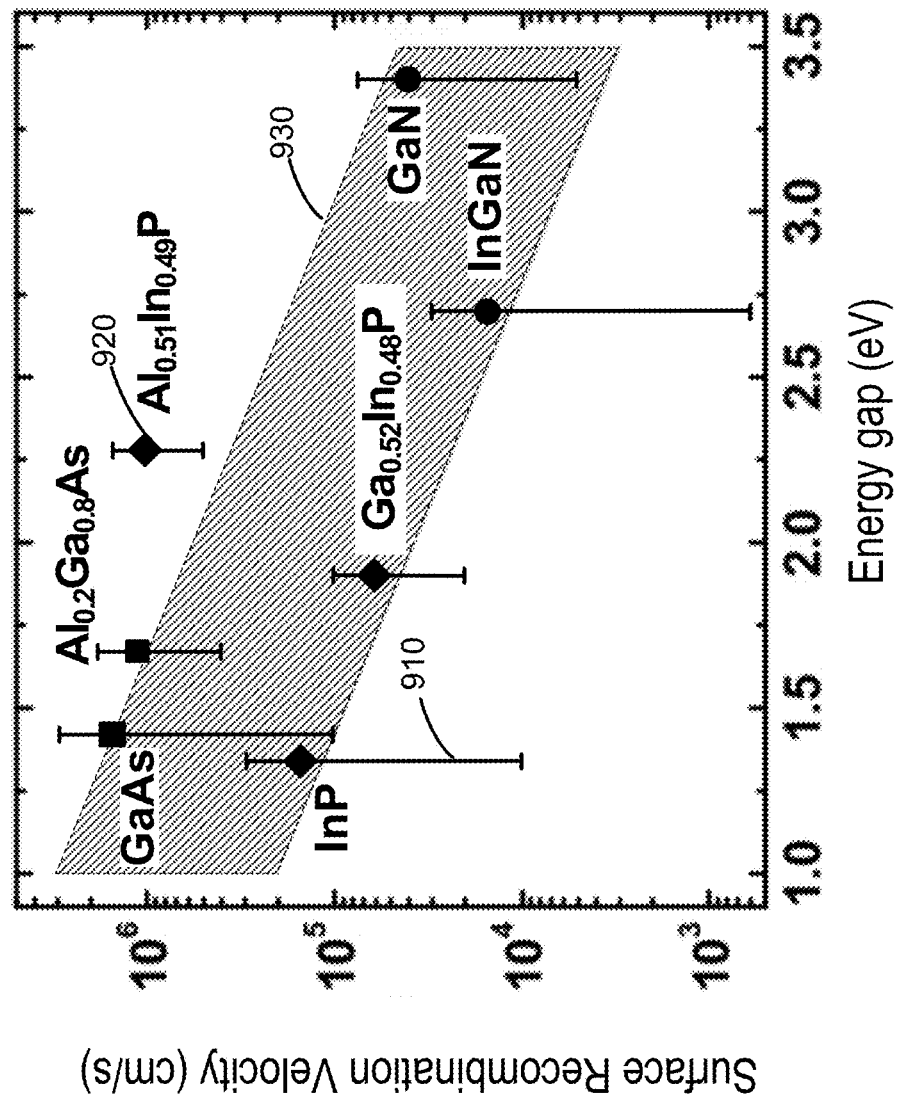
FIG. 9 illustrates surface recombination velocities of various III-V semiconductors.

FIG. 9 illustrates surface recombination velocities of various III-V semiconductor materials. Bars 910 in FIG. 9 show the ranges of reported SRV values of the III-V semiconductor materials, whereas symbols 920 on bars 910 indicate the common or averaged SRVs. A box 930 shows a general trend of the surface recombination velocity variation with the materials bandgap. As illustrated in FIG. 9, the SRV is high in GaAs (S~$10^6$ cm/s) compared to InP (S~$10^5$ cm/s) or GaN (S less than about $0.5 \times 10^5$ cm/s). The surface recombination velocity of AlGaInP material (e.g., ~$10^6$ cm/s) may be at least an order of magnitude higher than the surface recombination velocity of III-nitride materials (e.g., <$10^5$ cm/s). In addition, in Al-containing alloys, such as AlGaInP, SRVs may scale appreciably with the Al fraction. For example, the SRV may increase from about $10^5$ cm/s for $(Al_{0.1}Ga_{0.9})_{0.5}In_{0.5}P$ to about $10^6$ cm/s for $Al_{0.51}In_{0.49}P$.

In addition, nitride LEDs can operate at non-equilibrium carrier concentrations much higher than phosphide LEDs, which results in considerably shorter carrier lifetime in nitride LEDs. Therefore, the carrier diffusion lengths in the active regions of III-nitride LEDs are considerably shorter than the carrier diffusion lengths in phosphide LEDs. As such, phosphide LEDs, such as AlGaInP-based red micro-LEDs may have both higher SRVs and longer carrier diffusion lengths, and thus may have much higher surface recombination and efficiency reduction, than III-nitride LEDs.

Figure 10A:
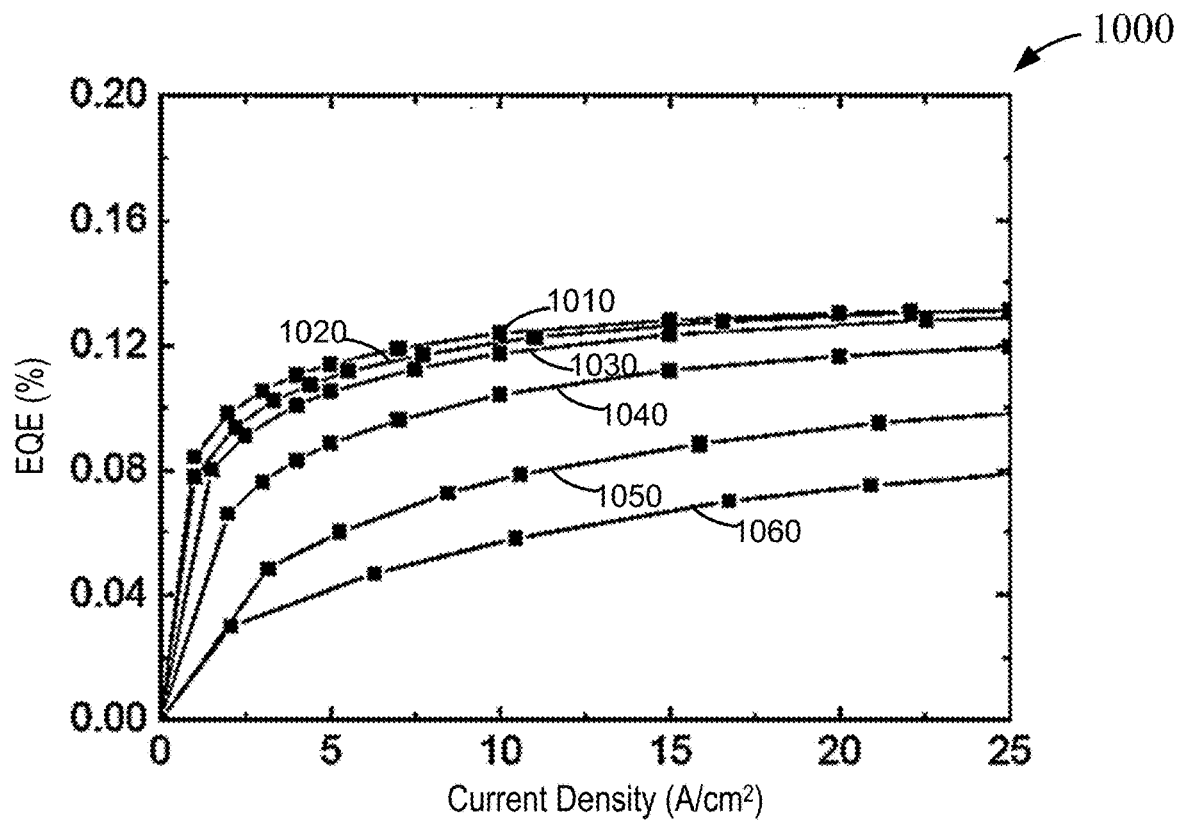
FIG. 10A illustrates examples of external quantum efficiencies of different AlGaInP red micro-LEDs having different physical sizes as a function of the current density.

FIG. 10A shows examples of external quantum efficiencies of different AlGaInP red LEDs having different physical sizes as a function of current density. Curves 1010, 1020, 1030, 1040, 1050, and 1060 show the EQEs of AlGaInP red LEDs with lateral sizes $15 \times 15$ μm², $22 \times 22$ μm², $50 \times 50$ μm², $100 \times 100$ μm², $150 \times 150$ μm², and $350 \times 350$ μm², respectively, as a function of the current density. FIG. 10A shows that the EQE is dependent on the LED size. Larger LEDs exhibit higher EQEs than smaller LEDs at the same current density. Curves 1010, 1020, and 1030 in FIG. 10A also show that, when the lateral sizes of the LEDs are greater than, for example, about $100 \times 100$ μm², the EQEs of the LEDs may be similar.

Figure 10B:
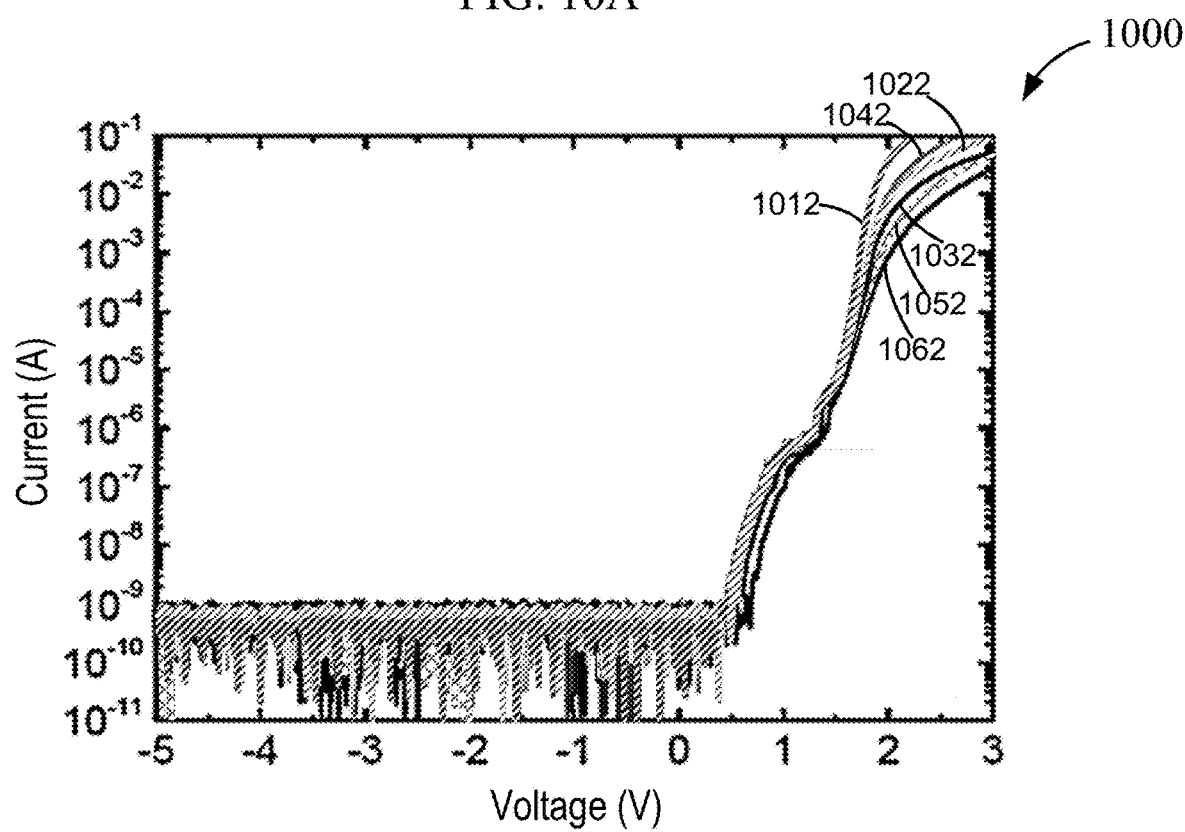
FIG. 10B illustrates examples of current-voltage (I-V) curves of different AlGaInP red micro-LEDs having different physical sizes.

FIG. 10B illustrates examples of current-voltage (I-V) curves of different AlGaInP red LEDs having different physical sizes. Curves 1012, 1022, 1032, 1042, 1052, and 1062 show the I-V curves of AlGaInP red LEDs with lateral sizes $15 \times 15$ μm², $22 \times 22$ μm², $50 \times 50$ μm², $100 \times 100$ μm², $150 \times 150$ μm², and $350 \times 350$ μm², respectively. At the same current, the series resistance and the forward voltage of the LED may increase with decreasing chip size. FIG. 10B shows that, even when the chip size decreases down to about $15 \times 15$ μm², the forward and reverse leakage current characteristics may not be degraded significantly. This indicates that the lower EQE of small LEDs may not be caused by the degradation in the current injection efficiency caused by the increased leakage current. FIGS. 10A and 10B indicate that the lower EQEs of small LEDs may be mainly caused by the non-radiative surface recombination.

The non-radiative surface recombination may be reduced by passivating the surface with a suitable dielectric material, such as $SiO_2$, $SiN_x$, or $Al_2O_3$. The SRV may be reduced by etching away highly defective surface material using a chemical treatment. Alternatively or in addition, surface recombination may be reduced by decreasing the lateral carrier mobility. For example, the lateral carrier mobility may be decreased by using ion implantation to disrupt the semiconductor lattice outside of a central portion of the micro-LED. The ion implantation may reduce the number of electrons that can reach the sidewall surface of the micro-LED, and therefore may reduce the amount of surface recombination. Bombarding the semiconductor material with high-energy ions may have two effects. First, the lattice of the semiconductor material may become less electrically conductive, so the current does not spread through the entire structure in all directions, and instead is funneled vertically through the central region. Second, the diffusivity is reduced in the bombarded region, such that the carriers do not move as far laterally. Thus, both the diffusivity D and the electron diffusion length L may be reduced by the ion implantation.

Alternatively or additionally, the lateral carrier mobility may be decreased by using quantum well intermixing to change the composition of areas of the semiconductor layer outside of the central portion of the micro-LED. Quantum well intermixing may be used to increase the bandgap in an outer region of the semiconductor layer by implanting ions in the outer region of the semiconductor layer and subsequently annealing the outer region of the semiconductor layer to intermix the ions with atoms within the outer region of the semiconductor layer. Thus, the quantum well intermixing may also reduce the number of electrons that can reach the sidewall surface of the micro-LED, and therefore can reduce the amount of surface recombination.

Despite these efforts to reduce surface recombination, when the micro-LED mesa size reduces, the efficiency of the micro-LED generally decreases and the peak efficiency operating current density generally increases, due to the non-radiative surface recombination. The overall electrical-to-optical power conversion efficiency (referred to as the wall-plug efficiency) of the device may be low.

According to certain embodiments, an AlGaInP red micro-LED may include structures and material compositions such that the current may be confined in a small localized region where the light emitting recombination may occur. The localized region may have a lateral linear dimension that is less than about ½, ⅓, ¼, ⅕, ⅛, ¹⁄₁₀, or smaller of the lateral linear dimension of the micro-LED (e.g., the lateral linear dimension of the mesa structure of the micro-LED). As a result, the diffusion of the carriers in the active region to the sidewall region, and thus the non-radiative surface recombination in the sidewall region, can be reduced to improve the quantum efficiency. In some embodiments, the current localization and current confinement may be achieved by, for example, a localized breakthrough of a barrier layer or other current aperture to limit the current injection region, lightly p-doped active layers to suppress lateral diffusion of carriers to the surface region, or any combination thereof.

In some embodiments, the barrier layer may include, for example, a thyristor, a tunnel junction, a heterojunction, or the like. The barrier layer may be close to the active region, such as within about a few carrier diffusion lengths or a carrier diffusion length from the active region. A localized contact, such as a spiked p-contact, a submicron p-contact, or a filament, on the barrier layer, when appropriately biased, may generate a high electric field at a localized region of the barrier layer to cause a localized breakthrough of the barrier layer such that current may be injected into the active region through the localized breakthrough region. The localized breakthrough region may function as a current aperture that limits the current injection to a small region. In some embodiments, the current injection may be localized through ion implantation, etching, oxidation, and the like.

Lightly p-doped active layers may suppress the lateral diffusion of the carriers to the surface region, such that the carriers that are injected into the active region from a small current aperture may remain in a small region within the active layers. For example, light p-doping in the active region may form a hole depletion region that can reduce the diffusion of holes to the sidewall region. Light p-doping in the active region may also cause the trap state to be farther away from the Fermi level. Therefore, the hole concentration at the sidewall can be reduced, and thus surface recombination can be reduced. The current localization in the active region can cause self-heating of the semiconductor, which may also reduce the diffusion of carriers to the sidewalls in the active region as the temperature increases. In addition, due to the confinement and localization of the current, light emission would occur in a localized region, which may facilitate efficient light extraction and out-coupling from the micro-LED. Therefore, the overall external quantum efficiency of the micro-LED may be improved significantly.

Figure 11B:
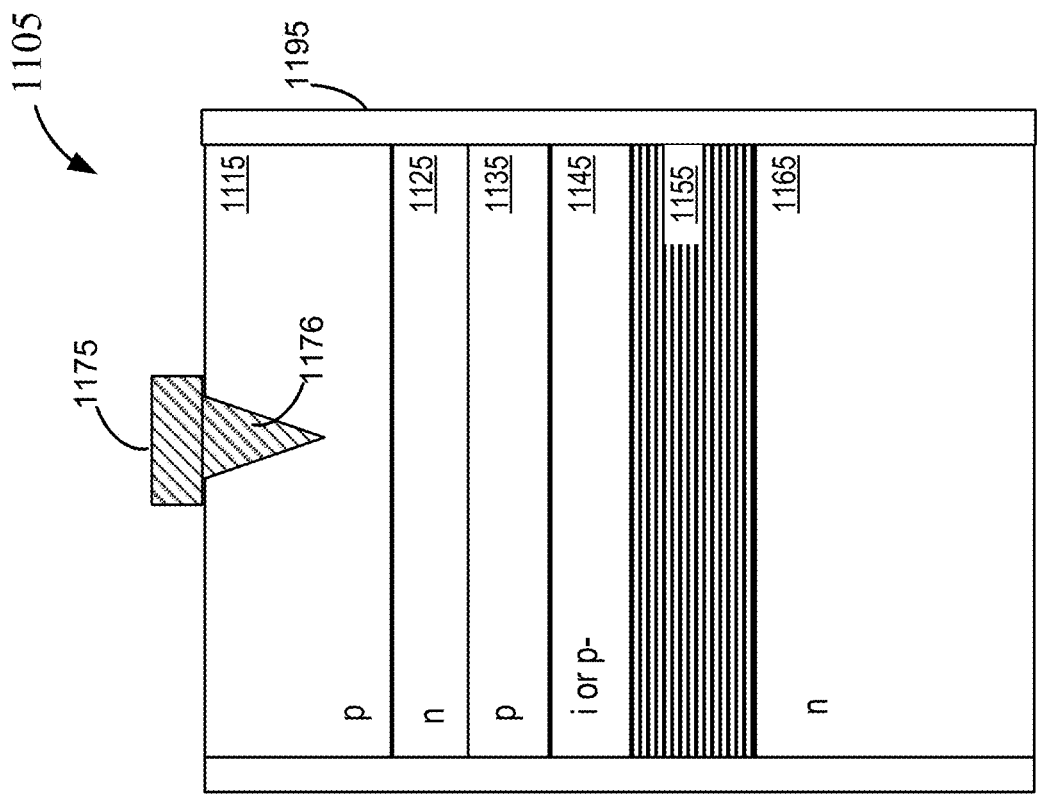
FIG. 11B illustrates an example of a micro-LED with an improved external quantum efficiency according to certain embodiments.
Figure 11A:
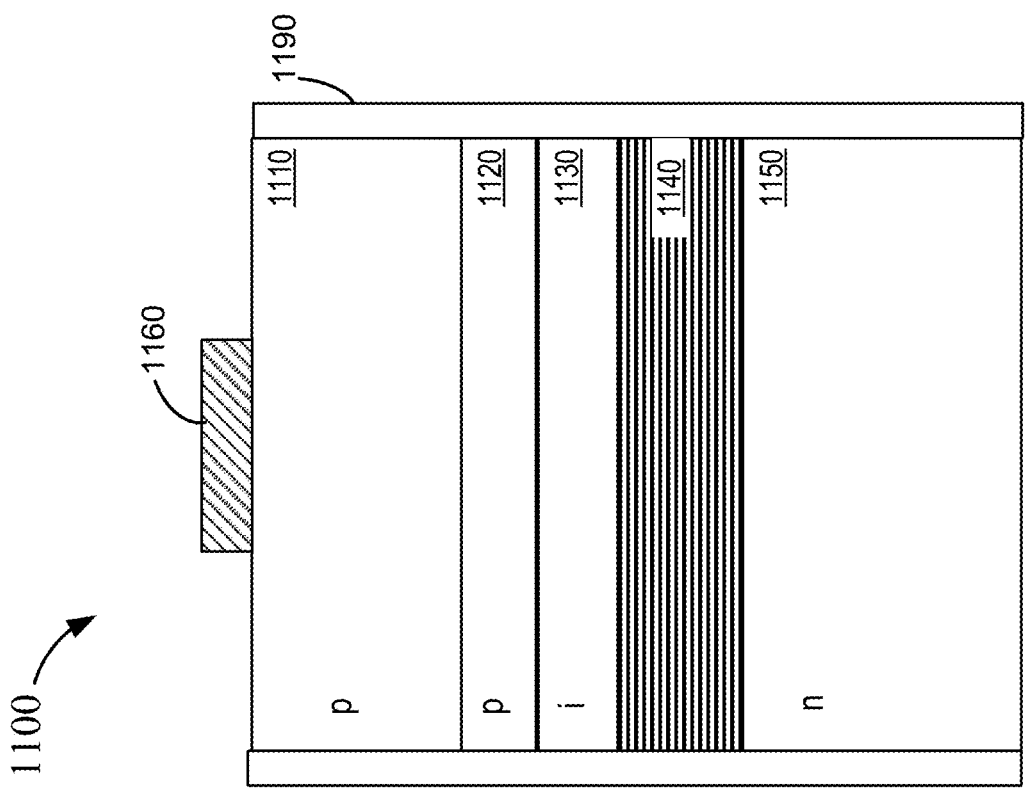
FIG. 11A illustrates an example of a micro-LED.

FIG. 11A illustrates an example of a micro-LED 1100. Micro-LED 1100 may be an example of LED 700. Micro-LED 1100 may include an n-type semiconductor layer 1150, such as an AlInP layer or AlGaInP layer doped with selenium, silicon, or tellurium. N-type semiconductor layer 1150 may be grown on, for example, a GaAs substrate or an AlGaAs layer. One or more active layers 1140 may be grown on n-type semiconductor layer 1150 to form an active region. For example, active layers 1140 may include one or more GaInP layers and one or more AlGaInP layers, which may form one or more heterostructures, such as one or more quantum wells or MQWs, where the GaInP layers may be quantum wells and the AlGaInP layers may be the quantum barrier layers. An intrinsic layer 1130 may be formed on active layers 1140. Intrinsic layer 1130 may be an electron blocking layer, a cladding layer, or a separate confinement layer, and may include, for example, an intrinsic AlGaInP layer. Intrinsic layer 1130 may confine the carriers and reduce the electron leakage current to improve the efficiency of the LED. A p-type layer 1120 may be formed on intrinsic layer 1130. P-type layer 1120 may include, for example, an AlInP or AlGaInP layer doped with zinc or magnesium. A p-type layer 1110 may be formed on p-type layer 1120. P-type layer 1110 may include, for example, a GaP layer, a GaInP layer, an AlInP layer, or an AlGaInP layer doped with zinc or magnesium. P-type layer 1110 may be heavily doped and may act as a contact layer for forming an ohmic contact with a metal electrode and reducing the contact impedance of the device. A p-contact layer 1160 may be formed on p-type layer 1110 as the anode. P-contact layer 1160 may include, for example, a metal layer (e.g., Al, Au, Ni, Ti, or any combination thereof), or an indium tin oxide (ITO) or Al/Ni/Au film. A passivation layer 1190 may be formed on the sidewalls of micro-LED 1100. Passivation layer 1190 may include an oxide layer (e.g., a SiO$_2$ layer) or another dielectric layer, and may act as a reflector to reflect the emitted light out of micro-LED 1100 as described above. Even though FIG. 11A shows a vertical mesa structure, micro-LED 1100 may include different mesa shapes, such as a conic, parabolic, inward-tilted, or outward-tilted mesa shape.

When a voltage signal is applied to p-type layer 1110 (e.g., through p-contact layer 1160) and n-type semiconductor layer 1150 (e.g., through a cathode not shown in FIG. 11A), electrons and holes may be injected into active layers 1140 and may recombine in active layers 1140, where the recombination of electrons and holes may cause photon emission. The emitted photons may be reflected by passivation layer 1190 and may exit micro-LED 1100 from the top (e.g., p-contact layer 1160 side). As described above, the internal quantum efficiency and the external quantum efficiency of micro-LED 1100 may be low at least due to the losses caused by the non-radiative surface recombination.

FIG. 11B illustrates an example of a micro-LED 1105 with an improved external quantum efficiency according to certain embodiments. As micro-LED 1100, micro-LED 1105 may include a mesa structure. The mesa structure of micro-LED 1105 may have a lateral linear dimension less than about 100 µm, less than about 50 µm, less than about 20 µm, less than about 10 µm, less than about 5 µm, less than about 3 µm, less than about 2 µm, or smaller. The mesa structure of micro-LED 1105 may include an n-type layer 1165 grown on, for example, a GaAs substrate or an AlGaAs layer. N-type layer 1165 may include, for example, an AlInP layer or AlGaInP layer doped with selenium, silicon, or tellurium. One or more active layers 1155 may be grown on n-type layer 1165 to form an active region. Active layers 1155 may include, for example, one or more GaInP layers (e.g., quantum well layers) and one or more AlGaInP layers (e.g., barrier layers), which may form one or more heterostructures, such as one or more quantum wells or MQWs. Optionally, a layer 1145 may be formed on active layers 1155. Layer 1145 may be an electron block layer, a cladding layer, or a separate confinement layer, and may include, for example, an intrinsic or p-type AlGaInP layer. Layer 1145 may confine the carriers in the active region and reduce the electron leakage current to improve the efficiency of micro-LED 1105. A p-type layer 1135 may be formed on layer 1145. P-type layer 1135 may include, for example, an AlInP or AlGaInP doped with zinc or magnesium. A thin n-type layer 1125 may be formed on p-type layer 1135. N-type layer 1125 may include, for example, an AlInP layer or AlGaInP layer doped with selenium, silicon, or tellurium. A p-type layer 1115 may be formed on n-type layer 1125. P-type layer 1115 may include, for example, a GaP layer, a GaInP layer, an AlInP layer, or an AlGaInP layer doped with zinc or magnesium. P-type layer 1115 may be heavily doped and may act as a contact layer for forming an ohmic contact and reducing the contact impedance of the device. A p-contact layer 1175 may be formed on p-type layer 1115 as an anode. P-contact layer 1175 may include, for example, a metal layer (e.g., Al, Au, Ni, Ti, or any combination thereof), or an indium tin oxide (ITO) or Al/Ni/Au film. A passivation layer 1195 may be formed on the sidewalls of micro-LED 1105. Passivation layer 1195 may include an oxide layer (e.g., a SiO$_2$ layer) or another dielectric layer, and may act as a reflector to reflect emitted light out of micro-LED 1105 as described above. Even though FIG. 11B shows a vertical mesa structure, micro-LED 1105 may include different mesa shapes, such as a conic, parabolic, inward-tilted, or outward-tilted mesa shape.

In micro-LED 1105 shown in FIG. 11B, p-type layer 1115, n-type layer 1125, and p-type layer 1135 may form a barrier layer having a PNP structure. P-type layer 1115, n-type layer 1125, p-type layer 1135, and n-type layer 1165 may form a thyristor that includes a p-n junction between p-type layer 1115 and n-type layer 1125, an n-p junction between n-type layer 1125 and p-type layer 1135, and a p-n junction (or p-i-n structure) between p-type layer 1135 and n-type layer 1165. When a positive voltage signal is applied to p-contact layer 1175 with respect to n-type layer 1165, the p-n junctions may be forward biased, while the n-p junction between n-type layer 1125 and p-type layer 1135 may be reverse biased. Therefore, the n-p junction may block the flow of the current from p-type layer 1115 to n-type layer 1165. When a negative voltage signal is applied to p-contact layer 1175 with respect to n-type layer 1165, n-p junction may be forward biased, while the p-n junctions may be reverse biased to block the flow of the current from n-type layer 1165 to p-type layer 1115. When a sufficiently high forward bias voltage signal is applied between p-contact layer 1175 and n-type layer 1165, the n-p junction may be in the breakdown state to conduct current, such that the thyristor may be in the forward conducting state. The thyristor may remain in the forward conducting state until the forward current drops below a threshold value (referred to as the "holding current"). For example, the thyristor may be switched off when it is reverse biased.

As illustrated in FIG. 11B, p-contact layer 1175 may include a structure 1176, such as a spike, a filament, a tapered tip, a V-shaped structure, or another submicron structure. In some embodiments, structure 1176 may extend into p-type layer 1115 to form a localized and tapered contact with p-type layer 1115. Thus, when a high voltage signal is applied to p-contact layer 1175, due to the small localized contact between structure 1176 and p-type layer 1115, a high electric field may be built in regions near structure 1176, which may cause a breakthrough in a small region of the n-p junction between n-type layer 1125 and p-type layer 1135 to turn on the thyristor. The small breakthrough region may be localized near structure 1176. The localized small breakthrough region may have a lateral linear dimension less than about $\frac{1}{2}$, $\frac{1}{3}$, $\frac{1}{4}$, $\frac{1}{5}$, $\frac{1}{8}$, $\frac{1}{10}$, or smaller of the lateral linear dimension of micro-LED 1105 (e.g., the lateral linear dimension of the mesa structure shown in FIG. 11B). As such, carriers (e.g., holes) may only be injected into active layers 1155 through the localized small breakthrough region and may combine with electrons in a small localized region in active layers 1155 to emit photons. The emitted photons may be reflected by passivation layer 1195 and may exit micro-LED 1105 from the top (e.g., p-contact layer 1175). Due to the lower mobility of holes compared with electrons, the recombination centers in active layers 1155 may be close to p-type layer 1135 (or layer 1145) and the localized small breakthrough region.

Micro-LED 1105 may be configured such that the distance between the barrier layer (or the n-p junction between n-type layer 1125 and p-type layer 1135) and active layers 1155 may be less than a few carrier diffusion lengths, such as less than about two times of the carrier diffusion length, less than about the carrier diffusion length, less than about one micron, or less than a few hundred nanometers. Thus, carriers (e.g., holes) injected into active layers 1155 through the localized small breakthrough region may not diffuse or may only diffuse for a short distance horizontally before the carriers recombine with other carriers (e.g., electrons) to emit photons. As such, the injected carriers may not reach the sidewall region of active layers 1155, and thus the non-radiative surface recombination may be reduced.

As described above, the current localization may also be achieved using other barrier layers or other techniques. For example, the current localization may be achieved using a tunnel junction, a heterojunction, a heterobarrier inducing band bending to form a tunnel contact, a Schottky barrier, or another barrier layer. In some embodiments, the current localization may be achieved using a current aperture formed by, for example, localized oxidation, localized ion implantation, localized etching, and the like.

Figure 12:
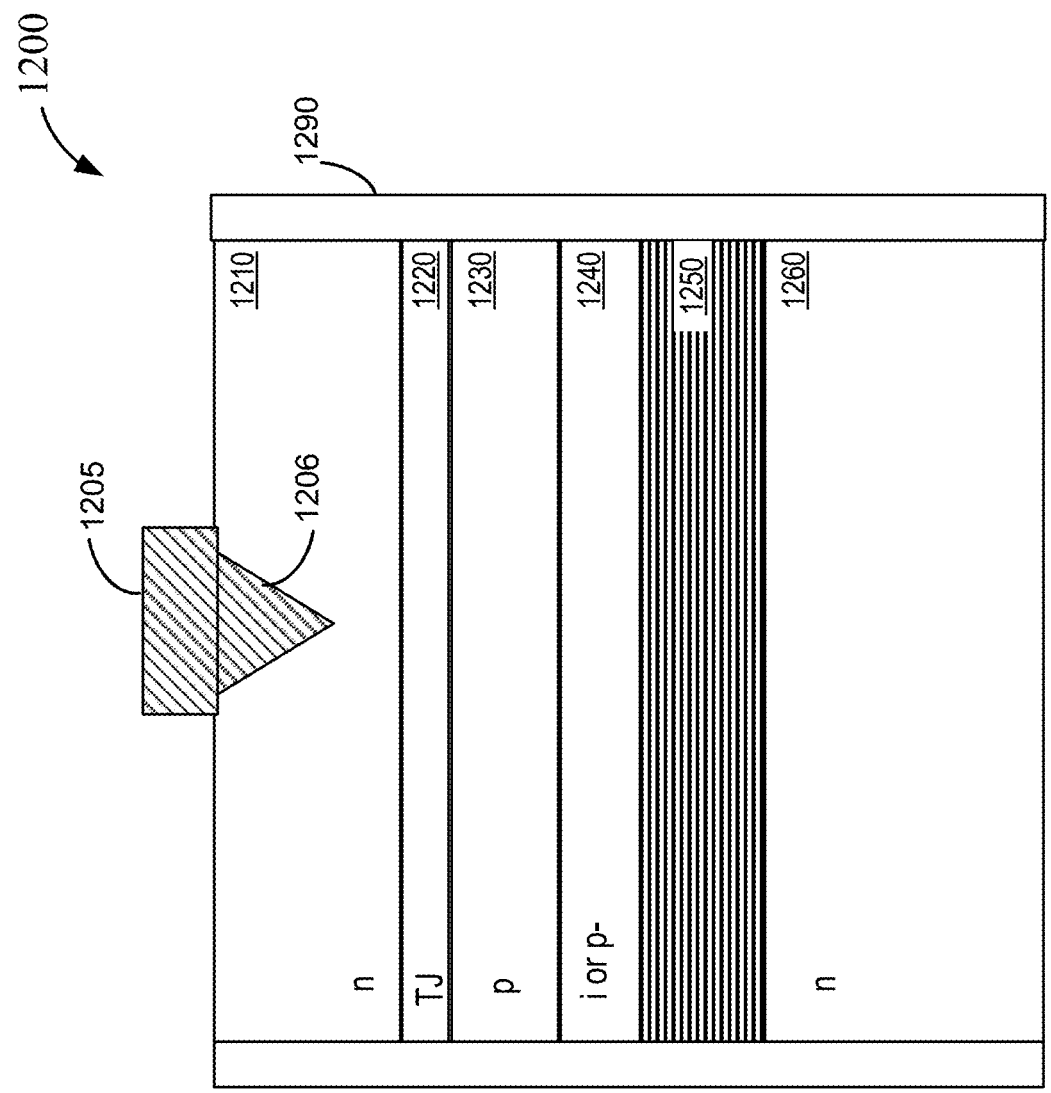
FIG. 12 illustrates an example of a micro-LED with an improved external quantum efficiency according to certain embodiments.

FIG. 12 illustrates an example of a micro-LED 1200 with an improved external quantum efficiency according to certain embodiments. Micro-LED 1200 may include a mesa structure that may have a lateral linear dimension less than about 100 µm, less than about 50 µm, less than about 20 µm, less than about 10 µm, less than about 5 µm, less than about 3 µm, less than about 2 µm, or smaller. The mesa structure of micro-LED 1200 may include an n-type layer 1260, such as an AlInP layer or AlGaInP layer doped with selenium, silicon, or tellurium. N-type layer 1260 may be grown on, for example, a GaAs substrate or an AlGaAs layer. One or more active layers 1250 may be grown on n-type layer 1260 to form an active region. Active layers 1250 may include, for example, one or more GaInP layers (e.g., as quantum well layers) and one or more AlGaInP layers (e.g., as quantum barrier layers), which may form one or more heterostructures, such as one or more quantum wells or MQWs. Optionally, a layer 1240 may be formed on active layers 1250. Layer 1240 may be an electron block layer, a cladding layer, or a separate confinement layer, and may include, for example, an intrinsic or p-type AlGaInP layer. Layer 1240 may confine the carriers in the active region and reduce the electron leakage current to improve the efficiency of the LED. A p-type layer 1230 may be formed on layer 1240. P-type layer 1230 may include, for example, an AlInP or AlGaInP doped with zinc or magnesium. An n-type layer 1210 may be formed on P-type layer 1230. N-type layer 1210 may include, for example, an AlInP, GaP, GaInP, or AlGaInP layer doped with selenium, silicon, or tellurium. In some embodiments, n-type layer 1210 and p-type layer 1230 may be heavily doped, such that a thin depletion layer may be formed between n-type layer 1210 and p-type layer 1230 to form a tunnel junction 1220. In some embodiments, a tunnel barrier layer including a higher bandgap material may be formed between n-type layer 1210 and p-type layer 1230 to form tunnel junction 1220. Tunnel junction 1220 may function as a carrier barrier layer. An electrode layer 1205 may be formed on n-type layer 1210. Electrode layer 1205 may include, for example, a metal layer (e.g., Al, Au, Ni, Ti, or any combination thereof), or an indium tin oxide (ITO) or Al/Ni/Au film. A passivation layer 1290 may be formed on the sidewalls of micro-LED 1200. Passivation layer 1290 may include an oxide layer (e.g., a SiO$_2$ layer) or another dielectric layer, and may act as a reflector to reflect emitted light out of micro-LED 1200 as described above. Even though FIG. 12 shows a vertical mesa structure, micro-LED 1200 may include different mesa shapes, such as conic, parabolic, inward-tilted, or outward-tilted mesa shapes.

In micro-LED 1200 shown in FIG. 12, n-type layer 1210, p-type layer 1230, and n-type layer 1260 may form an NPN structure. When micro-LED 1200 is forward biased, tunnel junction 1220 may be reverse biased. The reverse bias may create a favorable band alignment for tunneling electrons across the tunnel junction, which effectively injects holes into active layers 1250. Electrode layer 1205 may include a structure 1206, such as a spike, a filament, a tapered tip, a V-shaped structure, or another submicron structure. Thus, when a high voltage signal is applied to electrode layer 1205, due to the small localized contact between structure 1206 and n-type layer 1210, a high electric field may be built in localized regions near structure 1206, which may generate a small localized tunnel through tunnel junction 1220. The localized tunnel may have a lateral linear dimension that is less than about $\frac{1}{2}$, $\frac{1}{3}$, $\frac{1}{4}$, $\frac{1}{5}$, $\frac{1}{8}$, $\frac{1}{10}$, or smaller of the lateral linear dimension of micro-LED 1200 (e.g., the lateral linear dimension of the mesa structure shown in FIG. 12). As such, carriers may only be injected into active layers 1250 through the small localized tunnel and may recombine in a localized region in active layers 1250 to emit photons. The emitted photons may be reflected by passivation layer 1290 and may exit micro-LED 1200 from the top. Due to the lower mobility of holes compared with electrons, the recombination centers in active layers 1255 may be close to p-type layer 1230 (or layer 1240) and the localized breakthrough region.

Micro-LED 1200 may be configured such that the distance between tunnel junction 1220 and active layers 1250 may be less than a few carrier diffusion lengths, such as less than about two times of the carrier diffusion length, less than about the carrier diffusion length, less than a one micron, or less than a few hundred nanometers. For example, p-type layer 1230 and layer 1240 may be thin. Thus, carriers injected into active layers 1250 through the small localized tunnel may not diffuse or may only diffuse for a short distance horizontally before the carriers recombine to emit photons. As such, the injected carriers may not reach the sidewall region of active layers 1250, and thus the non-radiative surface recombination may be reduced and the quantum efficiency may be improved.

As described above, other techniques may also be used to localize the carrier injection. For example, a heterojunction may be used as a barrier layer, and may be used in combination with a small electrode structure (e.g., structure 1176 or 1206) to confine the current in a small localized region. In another example, a current aperture may be formed using a selectively oxidized layer that has a small unoxidized region. In another example, a current aperture may be formed by selective ion implantation in a semiconductor layer. In yet another example, a current aperture may be formed by selective etching in a semiconductor layer. The current aperture may have a lateral linear dimension that is less than about ½, ⅓, ¼, ⅕, ⅛, 1/10, or smaller of the lateral linear dimension of the micro-LED (e.g., the lateral linear dimension of the mesa structure of the micro-LED).

Additionally or alternatively, in some embodiments, the quantum well layers and/or the quantum barrier layers in a micro-LED, such as micro-LED 1105 or micro-LED 1200, may be p-doped. For example, the active layers (e.g., the quantum well layers) may be lightly p-doped with zinc or magnesium. In some embodiments, the active layer may be p-doped such that the integral of the acceptor concentration within the quantum well may be equal to or higher than the integral of the surface state density over the sidewall surface area of the quantum well. For example, the doping concentration may be about $10^{17}/cm^3$ or higher, such as between about $5\times10^{17}/cm^3$ and about $1\times10^{19}/cm^3$. Because the active region is homogeneously and lightly doped, the micro-LED may not experience performance degradation. The p-doped active layers may suppress lateral diffusion of the injected carriers (e.g., holes) to the mesa sidewall region, such that the carriers that are injected into active layers 1155 or 1250 from a small current aperture may remain in a small region within active layers 1155 or 1250. For example, light p-doping in active layers 1155 or 1250 may form a hole depletion region in active layers 1155 or 1250. The hole depletion region may reduce the diffusion of holes to the mesa sidewall region. P-doping may also favorably change the energy bands of the active layers near the mesa sidewall regions to reduce the concentration of the carriers at the mesa sidewall regions, thereby reducing the surface recombination. In some embodiments, the quantum barrier layers may also be p-doped to improve the hole transport and increase the efficiency of hole injection in the quantum wells.

Figure 13B:
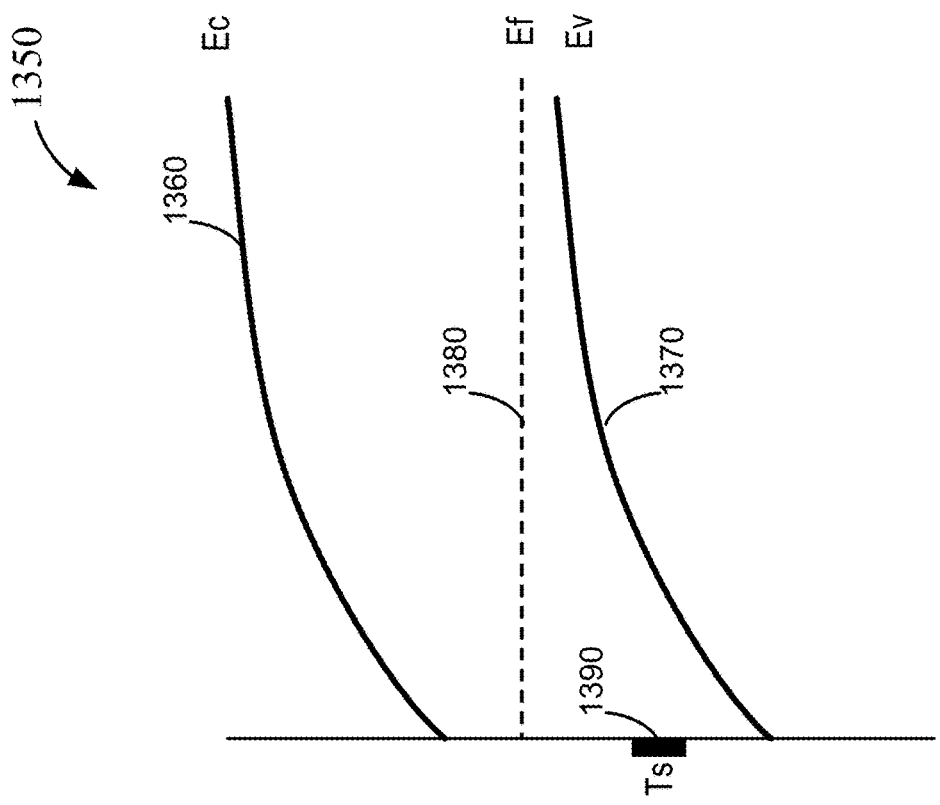
FIG. 13B illustrates an example of a band diagram of a p-doped active layer in a micro-LED.
Figure 13A:
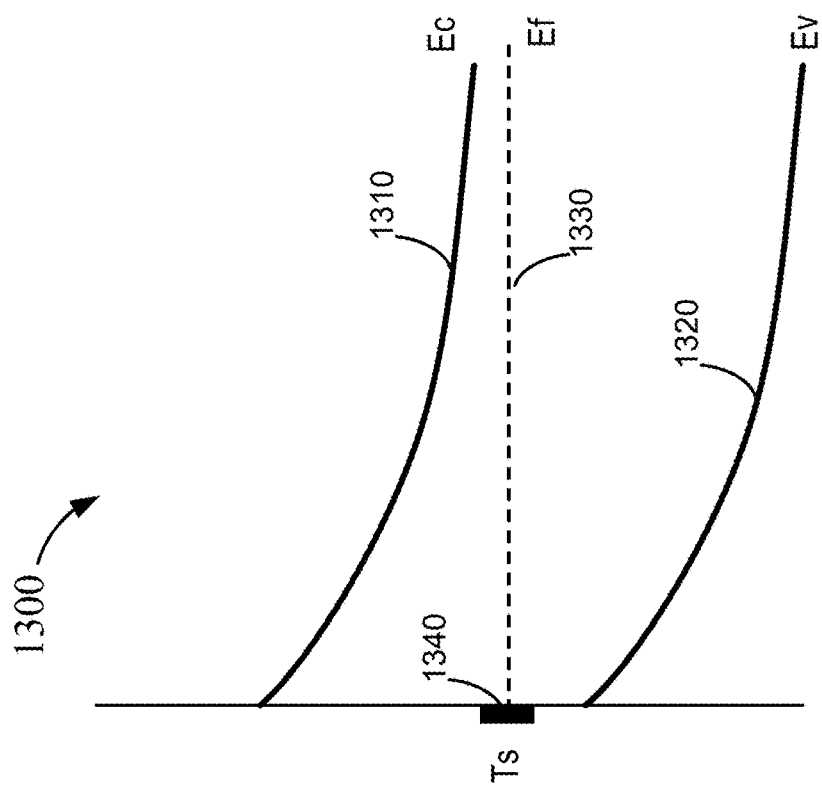
FIG. 13A illustrates an example of a band diagram of an n-doped active layer in a micro-LED.

FIG. 13A illustrates an example of a band diagram of an n-doped active layer. The n-doping may cause band bending in conductance band 1310 and valence band 1320 at the sidewall surface of the n-doped active layer. Due to the band bending at the sidewall surface of the n-doped active layer, the Fermi level 1330 at the sidewall surface may be close to the trap states 1340 formed by the defects. Therefore, the concentration of holes at sidewall surface of the n-doped active layer may be high to cause a high non-radiative surface recombination.

FIG. 13B illustrates an example of a band diagram of a p-doped active layer. The p-doping may cause band bending in conductance band 1360 and valence band 1370 at the sidewall surface of the p-doped active layer. Due to the band bending at the sidewall surface of the p-doped active layer, the Fermi level 1380 at the sidewall surface may be further away from the trap states 1390 formed by the defects. Therefore, the hole concentration at the sidewall surface can be reduced, and thus the non-radiative surface recombination can be reduced.

Due to the localized carrier injection through a small current aperture and/or the depression of the carrier diffusion in the active layers by the p-doping in the active layers, carriers may be confined to a region away from the sidewall surfaces in the active layers. The current localization in the active region can also cause self-heating of the semiconductor, which may also reduce the diffusion of carriers to the sidewalls in the active region as the temperature increases due to reduced carrier mobility and diffusivity at higher temperatures. In addition, due to the current confinement and localization, light emission may occur in a small localized region, which may facilitate more efficient light outcoupling from the micro-LED.

Figure 14A:
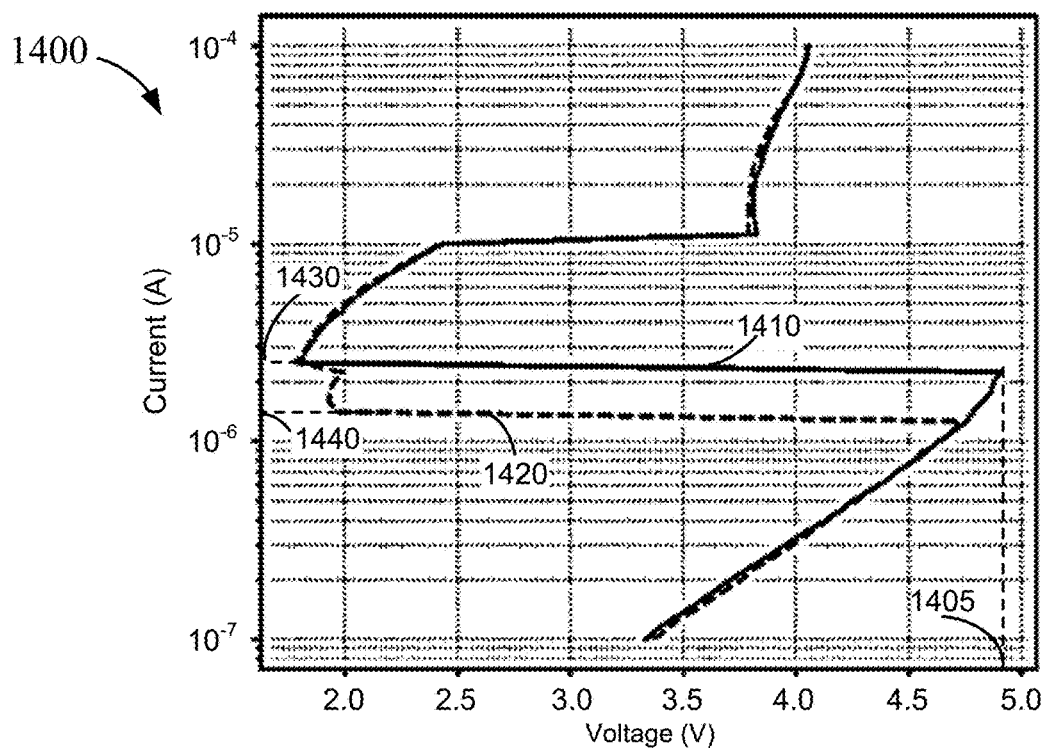
FIG. 14A illustrates examples of I-V curves of an example of an AlGaInP-based red micro-LED according to certain embodiments.

FIG. 14A includes a diagram 1400 illustrating examples of current-voltage (I-V) curves of an example of an AlGaInP-based red micro-LED according to certain embodiments. The micro-LED may have a configuration as described about with respect to, for example, micro-LED 1105, and may include a thyristor. A curve 1410 shows the I-V curve of the micro-LED as the bias voltage is gradually increased. A curve 1420 shows the I-V curve of the micro-LED as the bias voltage is gradually decreased. Curves 1410 and 1420 show that the micro-LED may behave in a way similar to a thyristor. As illustrated, when the forward bias voltage increases from about 3.5 V, the micro-LED may be in a forward blocking mode, where the forward leakage current may increase until the forward bias voltage reaches a breakdown voltage 1405 at close to about 5 V and the current reaches a latching current 1430 (e.g., about 2 μA). At breakdown voltage 1405, the micro-LED may be turned on, and the forward bias voltage may reduce significantly, while the current may maintain at about the latching current 1430. When the forward bias voltage increases while the micro-LED is on, the current may increase to a higher level (e.g., 10 μA), while the forward bias voltage remains relatively low (e.g., below about 2.5 V). The micro-LED may remain on until the bias voltage drops to a level where the current is below a holding current 1440 (e.g., below about 2 μA).

Figure 14B:
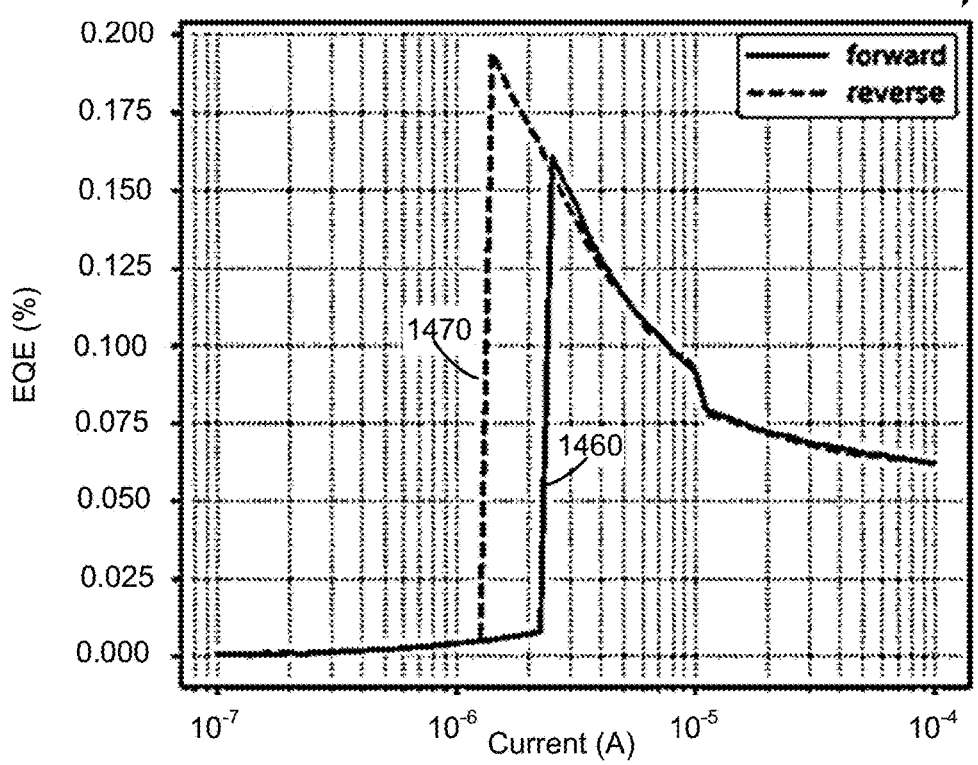
FIG. 14B illustrates the external quantum efficiency of the example of AlGaInP-based red micro-LED shown in FIG. 14A as a function of the injected current according to certain embodiments.

FIG. 14B includes a diagram 1450 illustrating the external quantum efficiency of the example of AlGaInP-based red micro-LED shown in FIG. 14A as a function of the injected current according to certain embodiments. A curve 1460 shows the relationship between the external quantum efficiency and the injected current of the micro-LED as the bias voltage is increased. A curve 1460 shows the relationship between the external quantum efficiency and the injected current of the micro-LED as the bias voltage is decreased. FIG. 14B shows that, when the micro-LED is turned on after the forward bias voltage exceeds the breakdown voltage (e.g., about 5 V) and the current reaches the latching current (e.g., above 2 µA), the external quantum efficiency can reach a high maximum value. When the micro-LED remains on and the bias voltage increases, the external quantum efficiency may start to decrease, which indicates that the loss due to auger recombination may increase due to the high current density in a small localized region in the action layers.

Figure 15A:
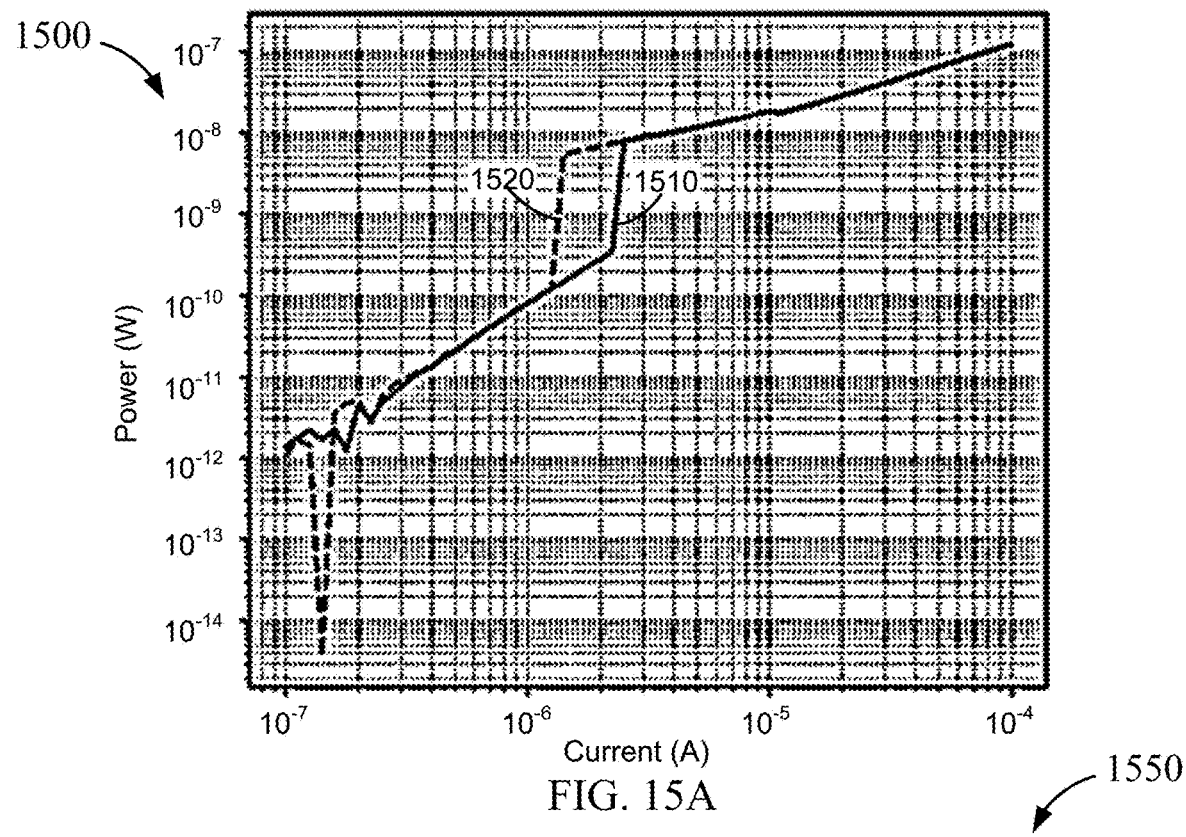
FIG. 15A illustrates the output power of the emitted light of the example of AlGaInP-based red micro-LED shown in FIG. 14A as a function of the injected current according to certain embodiments.

FIG. 15A includes a diagram 1500 illustrating the output power of the emitted light of the example of AlGaInP-based red micro-LED shown in FIG. 14A as a function of the injected current according to certain embodiments. A curve 1510 shows the relationship between the output power of the emitted light and the injected current of the micro-LED as the bias voltage is increased. A curve 1520 shows the relationship between the output power of the emitted light and the injected current of the micro-LED as the bias voltage is decreased. FIG. 15A shows that, when the micro-LED is turned on after the forward bias voltage exceeds the breakdown voltage and the current reaches the latching current (e.g., above 2 µA), the output power may increase significantly (e.g., jump more than 10 times). When the micro-LED remains on and the bias voltage further increases, the output power of the emitted light may continue to increase, but the external quantum efficiency may decrease.

Figure 15B:
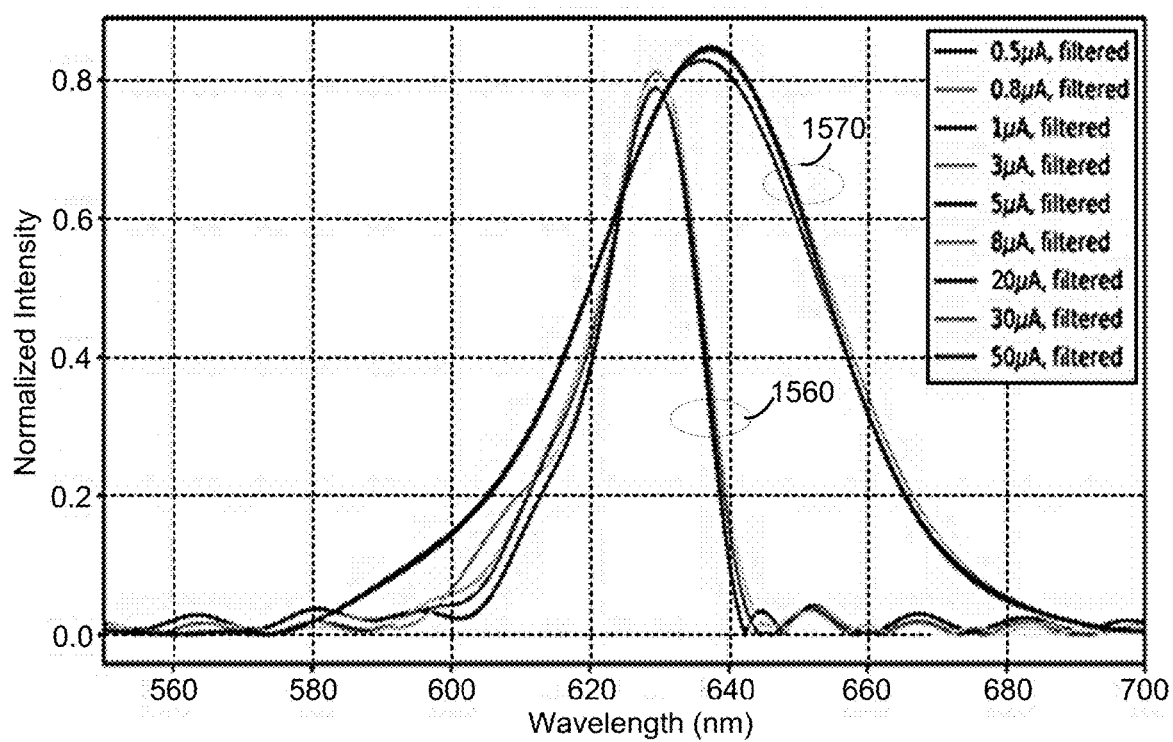
FIG. 15B illustrates the normalized output spectra of the emitted light of the example of AlGaInP-based red micro-LED shown in FIG. 14A at different current levels according to certain embodiments.

FIG. 15B includes a diagram 1550 illustrating the normalized output spectra of the emitted light of the example of AlGaInP-based red micro-LED shown in FIG. 14A at different current levels according to certain embodiments. Curves 1560 show the output spectra of the emitted light when the injected current is at 0.5 µA, 0.8 µA, and 1 µA. Curves 1570 show the output spectra of the emitted light when the injected current is above the latching current, such as at 3 µA, 5 µA, 8 µA, 20 µA, 30 µA, and 50 µA. FIG. 15B shows that there is an operation mode transition when the injected current increases from 1 µA to 3 µA, where the central wavelength of the emitted light may shift (e.g., about ten nanometers) to longer wavelengths and the output spectra may broaden significantly.

Figure 16:
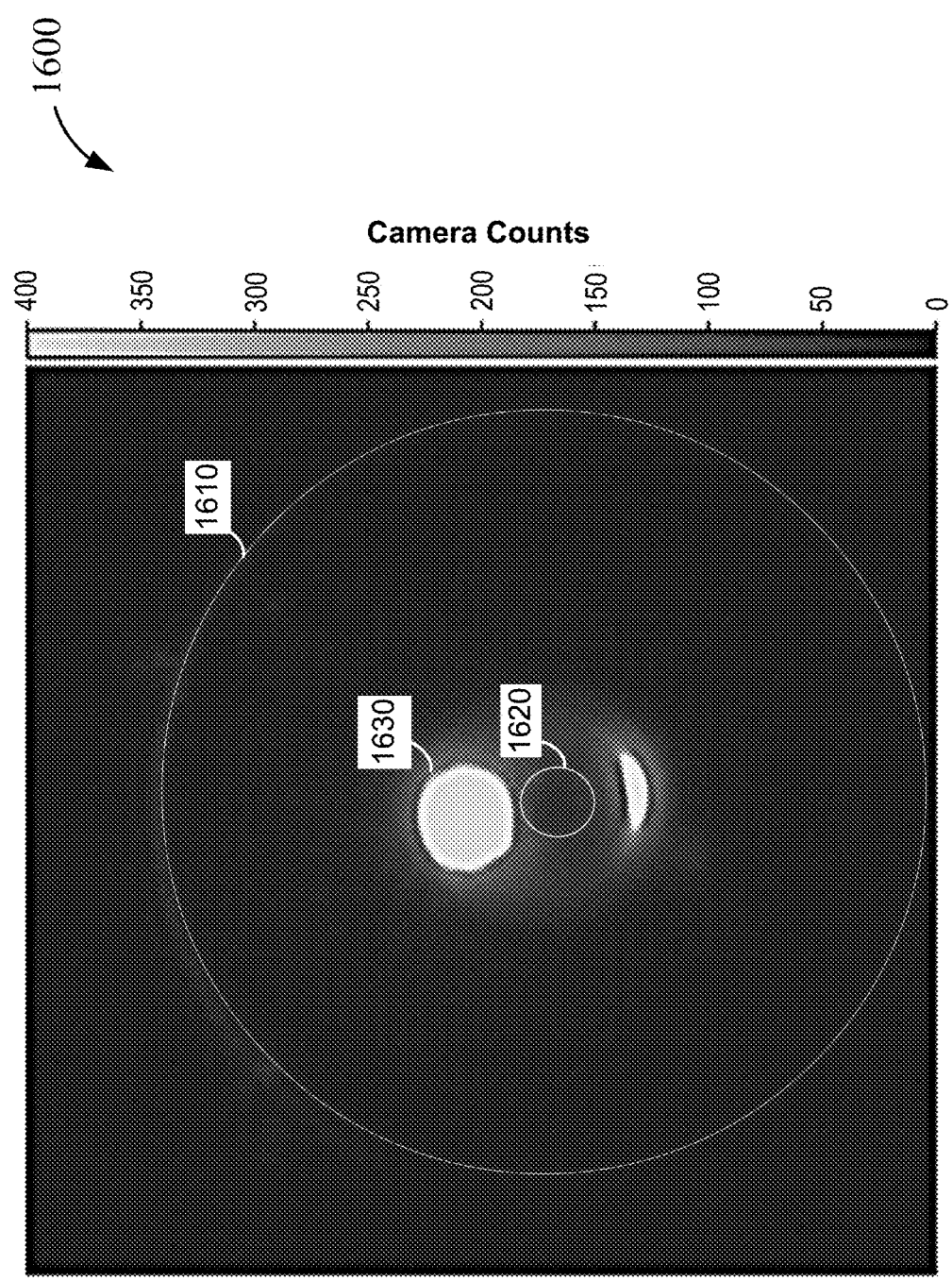
FIG. 16 includes an image illustrating the light emission pattern of the example of AlGaInP-based red micro-LED shown in FIG. 14A according to certain embodiments.

FIG. 16 includes an image 1600 of the light emission pattern of the example of AlGaInP-based red micro-LED shown in FIG. 14A according to certain embodiments. The area of the mesa structure of the micro-LED is shown by a circle 1610. The center electrode contact region is shown by a circle 1620. Image 1600 shows that the light emission is highly localized in a small region 1630 that is offset from the center electrode contact region.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

Figures 17A, 17B:
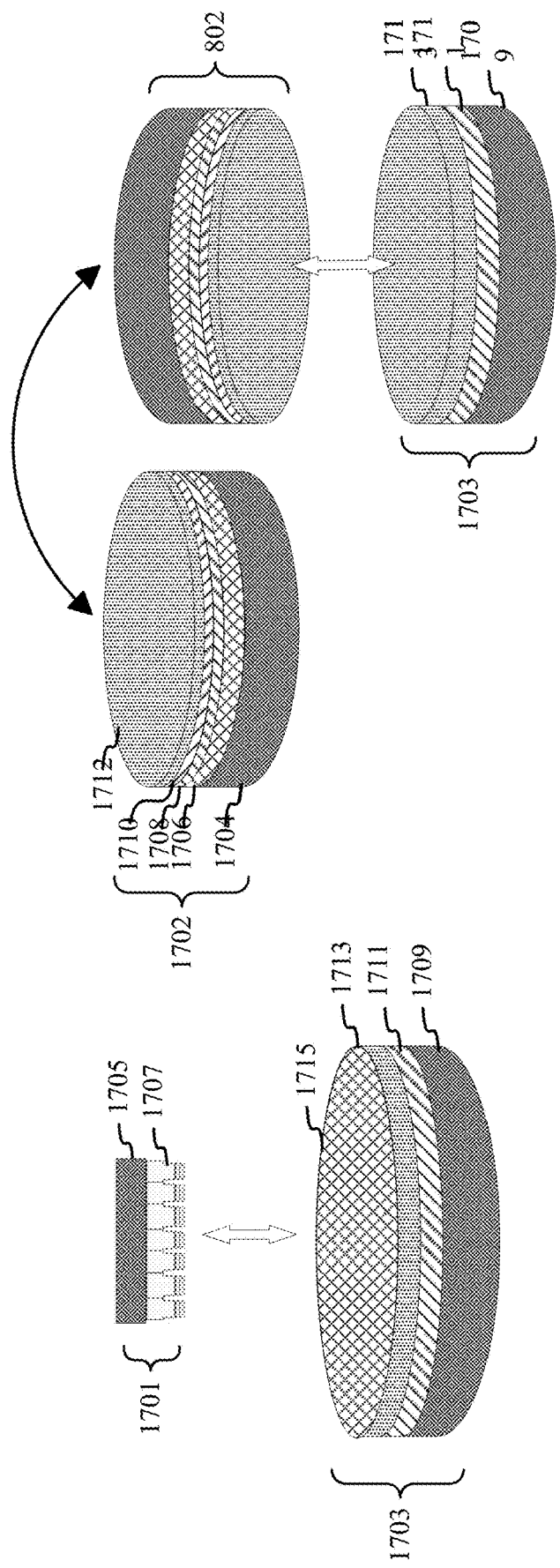
FIG. 17A illustrates an example of a method of die-to-wafer bonding for arrays of LEDs according to certain embodiments.
FIG. 17B illustrates an example of a method of wafer-to-wafer bonding for arrays of LEDs according to certain embodiments.

FIG. 17A illustrates an example of a method of die-to-wafer bonding for arrays of LEDs according to certain embodiments. In the example shown in FIG. 17A, an LED array 1701 may include a plurality of LEDs 1707 on a carrier substrate 1705. Carrier substrate 1705 may include various materials, such as GaAs, InP, GaN, AlN, sapphire, SiC, Si, or the like. LEDs 1707 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1703 may include a base layer 1709 having passive or active integrated circuits (e.g., driver circuits 1711) fabricated thereon. Base layer 1709 may include, for example, a silicon wafer. Driver circuits 1711 may be used to control the operations of LEDs 1707. For example, the driver circuit for each LED 1707 may include a 2T1C pixel structure that has two transistors and one capacitor. Wafer 1703 may also include a bonding layer 1713. Bonding layer 1713 may include various materials, such as a metal, an oxide, a dielectric, CuSn, AuTi, and the like. In some embodiments, a patterned layer 1715 may be formed on a surface of bonding layer 1713, where patterned layer 1715 may include a metallic grid made of a conductive material, such as Cu, Ag, Au, Al, or the like.

LED array 1701 may be bonded to wafer 1703 via bonding layer 1713 or patterned layer 1715. For example, patterned layer 1715 may include metal pads or bumps made of various materials, such as CuSn, AuSn, or nanoporous Au, that may be used to align LEDs 1707 of LED array 1701 with corresponding driver circuits 1711 on wafer 1703. In one example, LED array 1701 may be brought toward wafer 1703 until LEDs 1707 come into contact with respective metal pads or bumps corresponding to driver circuits 1711. Some or all of LEDs 1707 may be aligned with driver circuits 1711, and may then be bonded to wafer 1703 via patterned layer 1715 by various bonding techniques, such as metal-to-metal bonding. After LEDs 1707 have been bonded to wafer 1703, carrier substrate 1705 may be removed from LEDs 1707.

FIG. 17B illustrates an example of a method of wafer-to-wafer bonding for arrays of LEDs according to certain embodiments. As shown in FIG. 17B, a first wafer 1702 may include a substrate 1704, a first semiconductor layer 1706, active layers 1708, and a second semiconductor layer 1710. Substrate 1704 may include various materials, such as GaAs, InP, GaN, AlN, sapphire, SiC, Si, or the like. First semiconductor layer 1706, active layers 1708, and second semiconductor layer 1710 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1706 may be an n-type layer, and second semiconductor layer 1710 may be a p-type layer. For example, first semiconductor layer 1706 may be an n-doped GaN layer (e.g., doped with Si or Ge), and second semiconductor layer 1710 may be a p-doped GaN layer (e.g., doped with Mg, Ca, Zn, or Be). Active layers 1708 may include, for example, one or more GaN layers, one or more InGaN layers, one or more AlGaInP layers, and the like, which may form one or more heterostructures, such as one or more quantum wells or MQWs.

In some embodiments, first wafer 1702 may also include a bonding layer. Bonding layer 1712 may include various materials, such as a metal, an oxide, a dielectric, CuSn, AuTi, or the like. In one example, bonding layer 1712 may include p-contacts and/or n-contacts (not shown). In some embodiments, other layers may also be included on first wafer 1702, such as a buffer layer between substrate 1704 and first semiconductor layer 1706. The buffer layer may include various materials, such as polycrystalline GaN or AlN. In some embodiments, a contact layer may be between second semiconductor layer 1710 and bonding layer 1712. The contact layer may include any suitable material for providing an electrical contact to second semiconductor layer 1710 and/or first semiconductor layer 1706.

First wafer 1702 may be bonded to wafer 1703 that includes driver circuits 1711 and bonding layer 1713 as described above, via bonding layer 1713 and/or bonding layer 1712. Bonding layer 1712 and bonding layer 1713 may be made of the same material or different materials. Bonding layer 1713 and bonding layer 1712 may be substantially flat. First wafer 1702 may be bonded to wafer 1703 by various methods, such as metal-to-metal bonding, eutectic bonding, metal oxide bonding, anodic bonding, thermo-compression bonding, ultraviolet (UV) bonding, and/or fusion bonding.

As shown in FIG. 17B, first wafer 1702 may be bonded to wafer 1703 with the p-side (e.g., second semiconductor layer 1710) of first wafer 1702 facing down (i.e., toward wafer 1703). After bonding, substrate 1704 may be removed from first wafer 1702, and first wafer 1702 may then be processed from the n-side. The processing may include, for example, the formation of certain mesa shapes for individual LEDs, as well as the formation of optical components corresponding to the individual LEDs.

FIGS. 18A-18D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 18A shows a substrate 1810 with passive or active circuits 1820 manufactured thereon. As described above with respect to FIGS. 8A-8B, substrate 1810 may include, for example, a silicon wafer. Circuits 1820 may include driver circuits for the arrays of LEDs. A bonding layer may include dielectric regions 1840 and contact pads 1830 connected to circuits 1820 through electrical interconnects 1822. Contact pads 1830 may include, for example, Cu, Ag, Au, Al, W, Mo, Ni, Ti, Pt, Pd, or the like. Dielectric materials in dielectric regions 1840 may include SiCN, SiO$_2$, SiN, Al$_2$O$_3$, HfO$_2$, ZrO$_2$, Ta$_2$O$_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 1805. The activated surface may be atomically clean and may be reactive for formation of direct bonds between wafers when they are brought into contact, for example, at room temperature.

FIG. 18B illustrates a wafer 1850 including an array of micro-LEDs 1870 fabricated thereon as described above with respect to, for example, FIGS. 7A, 7B, 17A, and 17B. Wafer 1850 may be a carrier wafer and may include, for example, GaAs, InP, GaN, AlN, sapphire, SiC, Si, or the like. Micro-LEDs 1870 may include an n-type layer, an active region, and a p-type layer epitaxially grown on wafer 1850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 1880 and n-contacts 1882 may be formed in a dielectric material layer 1860 deposited on the mesa structures and may make electrical contacts with the p-type layer and the n-type layers, respectively. Dielectric materials in dielectric material layer 1860 may include, for example, SiCN, SiO$_2$, SiN, Al$_2$O$_3$, HfO$_2$, ZrO$_2$, Ta$_2$O$_5$, or the like. P-contacts 1880 and n-contacts 1882 may include, for example, Cu, Ag, Au, Al, W, Mo, Ni, Ti, Pt, Pd, or the like. The top surfaces of p-contacts 1880, n-contacts 1882, and dielectric material layer 1860 may form a bonding layer. The bonding layer may be planarized and polished using, for example, chemical mechanical polishing, where the polishing may cause dishing in p-contacts 1880 and n-contacts 1882. The bonding layer may then be cleaned and activated by, for example, an ion (e.g., plasma) or fast atom (e.g., Ar) beam 1815. The activated surface may be atomically clean and reactive for formation of direct bonds between wafers when they are brought into contact, for example, at room temperature.

FIG. 18C illustrates a room temperature bonding process for bonding the dielectric materials in the bonding layers. For example, after the bonding layer that includes dielectric regions 1840 and contact pads 1830 and the bonding layer that includes p-contacts 1880, n-contacts 1882, and dielectric material layer 1860 are surface activated, wafer 1850 and micro-LEDs 1870 may be turned upside down and brought into contact with substrate 1810 and the circuits formed thereon. In some embodiments, compression pressure 1825 may be applied to substrate 1810 and wafer 1850 such that the bonding layers are pressed against each other. Due to the surface activation and the dishing in the contacts, dielectric regions 1840 and dielectric material layer 1860 may be in direct contact because of the surface attractive force, and may react and form chemical bonds between them because the surface atoms may have dangling bonds and may be in unstable energy states after the activation. Thus, the dielectric materials in dielectric regions 1840 and dielectric material layer 1860 may be bonded together with or without heat treatment or pressure.

FIG. 18D illustrates an annealing process for bonding the contacts in the bonding layers after bonding the dielectric materials in the bonding layers. For example, contact pads 1830 and p-contacts 1880 or n-contacts 1882 may be bonded together by annealing at, for example, about 200-400° C. or higher. During the annealing process, heat 1835 may cause the contacts to expand more than the dielectric materials (due to different coefficients of thermal expansion), and thus may close the dishing gaps between the contacts such that contact pads 1830 and p-contacts 1880 or n-contacts 1882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 19:
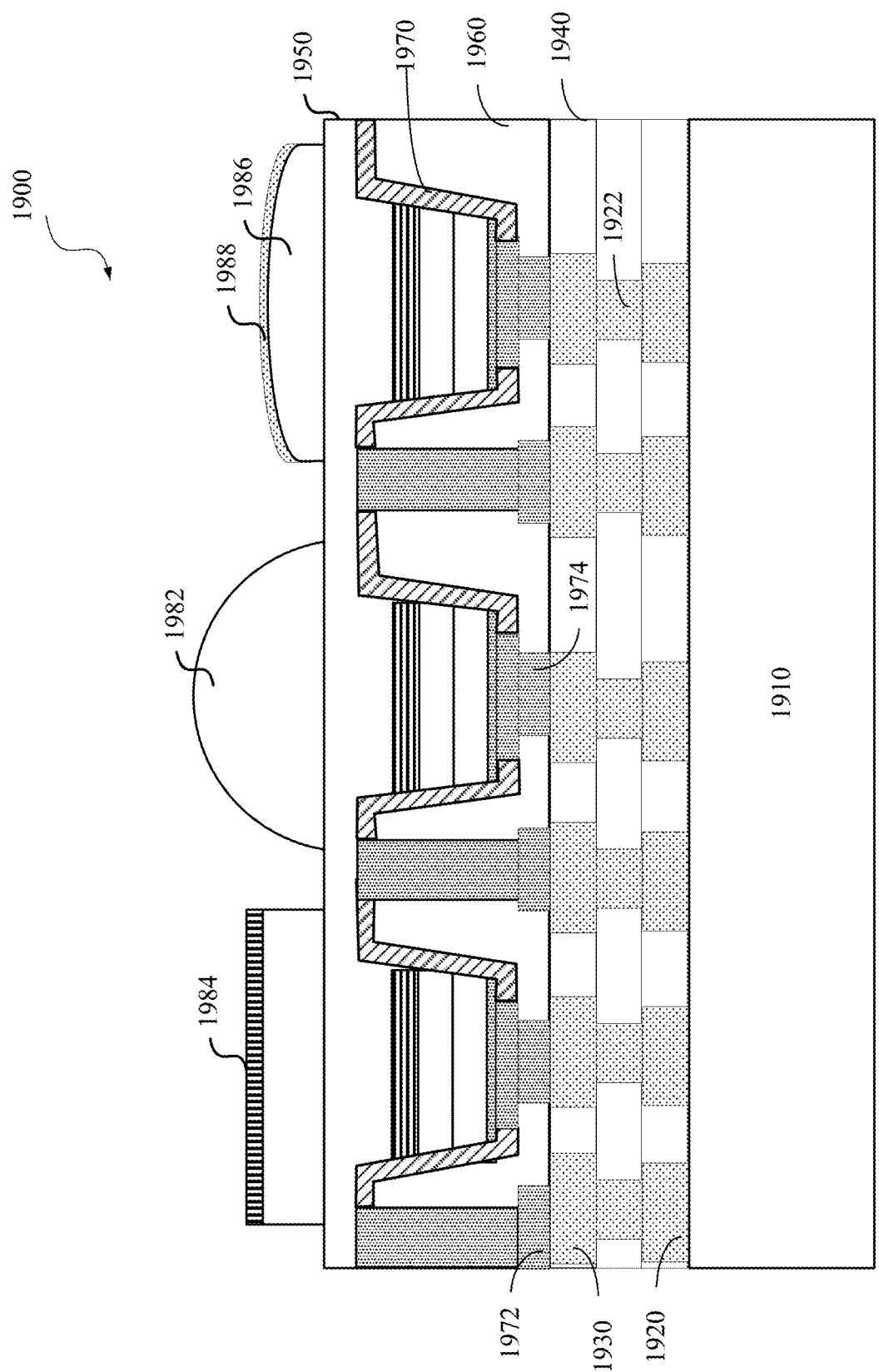
FIG. 19 illustrates an example of an LED array with secondary optical components fabricated thereon according to certain embodiments.

FIG. 19 illustrates an example of an LED array 1900 with secondary optical components fabricated thereon according to certain embodiments. LED array 1900 may be made by bonding an LED chip or wafer with a silicon wafer including electrical circuits fabricated thereon, using any suitable bonding techniques described above with respect to, for example, FIGS. 17A-18D. In the example shown in FIG. 19, LED array 1900 may be bonded using a wafer-to-wafer hybrid bonding technique as described above with respect to FIG. 18A-18D.

LED array 1900 may include a substrate 1910, which may be, for example, a silicon wafer. Integrated circuits 1920, such as LED driver circuits, may be fabricated on substrate 1910. Integrated circuits 1920 may be connected to p-contacts 1974 and n-contacts 1972 of micro-LEDs 1970 through interconnects 1922 and contact pads 1930, where contact pads 1930 may form metallic bonds with p-contacts 1974 and n-contacts 1972. Dielectric layer 1940 on substrate 1910 may be bonded to dielectric layer 1960 through fusion bonding.

The substrate (not shown) of the LED chip or wafer may be thinned or may be removed to expose the n-type layer 1950 of micro-LEDs 1970. Various secondary optical components, such as a spherical micro-lens 1982, a grating 1984, a micro-lens 1986, an antireflection layer 1988, and the like, may be formed in or on top of n-type layer 1950. For example, spherical micro-lens arrays may be etched in the semiconductor materials of micro-LEDs 1970 using a grayscale mask and a photoresist with a linear response to exposure light, or using an etch mask formed by thermal reflowing of a patterned photoresist layer. The secondary optical components may also be etched in a dielectric layer deposited on n-type layer 1950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 1970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 19 to show some examples of secondary optical components that can be formed on micro-LEDs 1970, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 20:
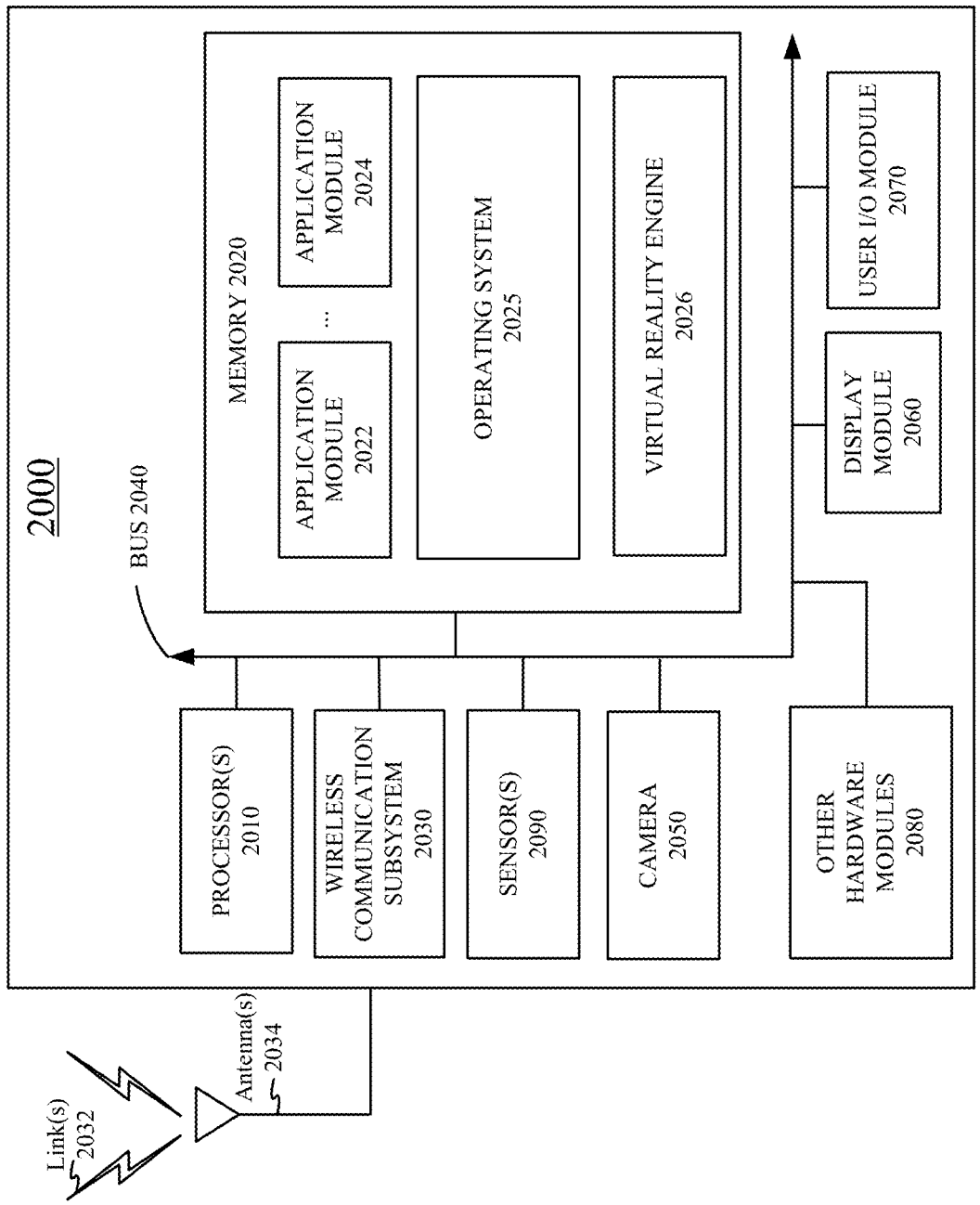
FIG. 20 is a simplified block diagram of an electronic system of an example of a near-eye display according to certain embodiments.

FIG. 20 is a simplified block diagram of an example electronic system 2000 of an example near-eye display (e.g., HMD device) for implementing some of the examples disclosed herein. Electronic system 2000 may be used as the electronic system of an HMD device or other near-eye displays described above. In this example, electronic system 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within electronic system 2000. To realize this communicative coupling, processor(s) 2010 may communicate with the other illustrated components across a bus 2040. Bus 2040 may be any subsystem adapted to transfer data within electronic system 2000. Bus 2040 may include a plurality of computer buses and additional circuitry to transfer data.

Memory 2020 may be coupled to processor(s) 2010. In some embodiments, memory 2020 may offer both short-term and long-term storage and may be divided into several units. Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for electronic system 2000. In some embodiments, memory 2020 may be distributed into different hardware modules. A set of instructions and/or code might be stored on memory 2020. The instructions might take the form of executable code that may be executable by electronic system 2000, and/or might take the form of source and/or installable code, which, upon compilation and/or installation on electronic system 2000 (e.g., using any of a variety of generally available compilers, installation programs, compression/decompression utilities, etc.), may take the form of executable code.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function or eye tracking function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of electronic system 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) 2034 and wireless link(s) 2032. Wireless communication subsystem 2030, processor(s) 2010, and memory 2020 may together comprise at least a part of one or more of a means for performing some functions disclosed herein.

Embodiments of electronic system 2000 may also include one or more sensors 2090. Sensor(s) 2090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2000 may include a display module 2060. Display module 2060 may be a near-eye display, and may graphically present information, such as images, videos, and various instructions, from electronic system 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use LCD technology, LED technology (including, for example, OLED, ILED, µ-LED, AMO-LED, TOLED, etc.), light emitting polymer display (LPD) technology, or some other display technology.

Electronic system 2000 may include a user input/output module 2070. User input/output module 2070 may allow a user to send action requests to electronic system 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2000. In some embodiments, user input/output module 2070 may provide haptic feedback to the user in accordance with instructions received from electronic system 2000. For example, the haptic feedback may be provided when an action request is received or has been performed.

Electronic system 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a complementary metal-oxide-semiconductor (CMOS) image sensor with a few millions or tens of millions of pixels. In some implementations, camera 2050 may include two or more cameras that may be used to capture 3-D images.

In some embodiments, electronic system 2000 may include a plurality of other hardware modules 2080. Each of other hardware modules 2080 may be a physical module within electronic system 2000. While each of other hardware modules 2080 may be permanently configured as a structure, some of other hardware modules 2080 may be temporarily configured to perform specific functions or temporarily activated. Examples of other hardware modules 2080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of electronic system 2000 may also store a virtual reality engine 2026. Virtual reality engine 2026 may execute applications within electronic system 2000 and receive position information, acceleration information, velocity information, predicted future positions, or any combination thereof of the HMD device from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for the HMD device that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

In various implementations, the above-described hardware and modules may be implemented on a single device or on multiple devices that can communicate with one another using wired or wireless connections. For example, in some implementations, some components or modules, such as GPUs, virtual reality engine 2026, and applications (e.g., tracking application), may be implemented on a console separate from the head-mounted display device. In some implementations, one console may be connected to or support more than one HMD.

In alternative configurations, different and/or additional components may be included in electronic system 2000. Similarly, functionality of one or more of the components can be distributed among the components in a manner different from the manner described above. For example, in some embodiments, electronic system 2000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A micro-light emitting diode comprising:
a first n-type semiconductor layer;
an active region on the first n-type semiconductor layer;
a first p-type semiconductor layer on the active region;
a carrier barrier region on the first p-type semiconductor layer, the carrier barrier region including a second n-type semiconductor layer on a side of the first p-type semiconductor layer, the side opposing the first n-type semiconductor layer; and
an electrode including a tapered or submicron structure that is in contact with the carrier barrier region and is configured to apply an electric field to a localized area of the carrier barrier region to cause a breakthrough in the localized area of the carrier barrier region.

2. The micro-light emitting diode of claim 1, wherein the carrier barrier region includes:
a second p-type semiconductor layer on the second n-type semiconductor layer,
wherein the second p-type semiconductor layer, the second n-type semiconductor layer, and the first p-type semiconductor layer form a PNP device.

3. The micro-light emitting diode of claim 2, wherein the PNP device and the first n-type semiconductor layer form a thyristor.

4. The micro-light emitting diode of claim 1, wherein:
the second n-type semiconductor layer includes an n+semiconductor layer on the first p-type semiconductor layer;
the first p-type semiconductor layer includes a p+semiconductor layer; and
the n+semiconductor layer and the first p-type semiconductor layer form a tunnel junction.

5. The micro-light emitting diode of claim 1, wherein the carrier barrier region includes a heterojunction, a Schottky barrier, or a heterobarrier that induces band bending to form a tunnel contact.

6. The micro-light emitting diode of claim 1, wherein a distance between the carrier barrier region and the active region is less than a carrier diffusion length of the active region.

7. The micro-light emitting diode of claim 1, wherein the active region includes an AlGaInP quantum well and is configured to emit red light.

8. The micro-light emitting diode of claim 1, wherein the active region includes at least one of a p-doped quantum barrier layer or a p-doped quantum well layer.

9. The micro-light emitting diode of claim 8, wherein the p-doped quantum well layer is characterized by an acceptor concentration between $1\times10^{17}/cm^3$ and $1\times10^{19}/cm^3$.

10. The micro-light emitting diode of claim 1, wherein the tapered or submicron structure includes a spike or a tapered tip extending into the carrier barrier region.

11. The micro-light emitting diode of claim 1, wherein the micro-light emitting diode is characterized by a linear dimension less than 20 μm.

12. The micro-light emitting diode of claim 1, wherein the localized area of the carrier barrier region is characterized by a linear dimension less than one third of a linear dimension of the micro-light emitting diode.

13. A micro-light emitting diode comprising:
a first n-type semiconductor layer;
an active region on the first n-type semiconductor layer, the active region including at least one p-doped quantum well;
a first p-type semiconductor layer on the active region;
a current confinement structure including a localized current aperture and configured to inject carriers into the active region through the localized current aperture, the current confinement structure including a second n-type semiconductor layer on a side of the first p-type semiconductor layer opposing the first n-type semiconductor layer; and
an electrode on the localized current aperture of the current confinement structure, the electrode including a tapered or submicron structure that is in contact with the current confinement structure and is configured to apply an electric field to a localized area of the current confinement structure to cause a breakthrough in the localized area of the current confinement structure to form the localized current aperture.

14. The micro-light emitting diode of claim 13, wherein:
the current confinement structure includes a carrier barrier layer.

15. The micro-light emitting diode of claim 14, wherein the carrier barrier layer includes:
the second n-type semiconductor layer on the side of the first p-type semiconductor layer; and a second p-type semiconductor layer on the second n-type semiconductor layer, wherein the second p-type semiconductor layer, the second n-type semiconductor layer, the first p-type semiconductor layer, and the first n-type semiconductor layer form a thyristor.

16. The micro-light emitting diode of claim 14, wherein the carrier barrier layer includes a tunnel junction or a heterojunction.

17. The micro-light emitting diode of claim 13, wherein the p-doped quantum well is characterized by an acceptor concentration between $1\times10^{17}/cm^3$ and $1\times10^{19}/cm^3$.

18. The micro-light emitting diode of claim 13, wherein the localized current aperture is characterized by a linear dimension less than one third of a linear dimension of the micro-light emitting diode.

19. The micro-light emitting diode of claim 13, wherein the active region includes an AlGaInP layer and is configured to emit red light.

20. A micro-light emitting diode comprising:
a first n-type semiconductor layer;
an active region on the first n-type semiconductor layer;
a first p-type semiconductor layer on the active region;
a carrier barrier region on the first p-type semiconductor layer, the carrier barrier region including a tunnel barrier layer on the first p-type semiconductor layer, and a second n-type semiconductor layer on the tunnel barrier layer, wherein the tunnel barrier layer has a higher bandgap than the first p-type semiconductor layer and the second n-type semiconductor layer, the carrier barrier region configured to block a current flow upon receiving a low electric field; and
an electrode including a pointed or submicron structure protruding into the carrier barrier region and is configured to apply, via the pointed structure, a high electric field to a localized area of the carrier barrier region to cause a breakthrough in the localized area of the carrier barrier region.

* * * * *